US009400307B2

(12) United States Patent
Tamura et al.

(10) Patent No.: US 9,400,307 B2
(45) Date of Patent: Jul. 26, 2016

(54) TEST SYSTEM FOR IMPROVING THROUGHOUT OR MAINTENANCE PROPERTIES OF SEMICONDUCTOR TESTING

(71) Applicant: Keysight Technologies, Inc., Minneapolis, MN (US)

(72) Inventors: Hiroshi Tamura, Loveland, CO (US); Takuro Nishimura, Loveland, CO (US); Tomonobu Hiramatsu, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 543 days.

(21) Appl. No.: 13/801,694

(22) Filed: Mar. 13, 2013

(65) Prior Publication Data

US 2014/0266282 A1  Sep. 18, 2014

(51) Int. Cl.
*G01R 31/26* (2014.01)
*G01R 31/28* (2006.01)

(52) U.S. Cl.
CPC ................... *G01R 31/2834* (2013.01)

(58) Field of Classification Search
CPC ........... G01R 31/2834; G01R 31/2832; G01R 31/2831; G01R 31/2851; G01R 31/31707; G01R 31/318371
USPC ............. 324/756.01–756.07, 760.01–760.02, 324/761.01, 762.01–762.1, 754.01–754.2, 324/755.01–755.11, 73.1; 714/724–733, 714/738–744
See application file for complete search history.

(56) References Cited

U.S. PATENT DOCUMENTS 5,493,070 A    2/1996   Habu
6,195,774 B1   2/2001   Jacobson
(Continued)

FOREIGN PATENT DOCUMENTS

CN   1784609 B    6/2006
TW   287639       10/2007
TW   389033       3/2013

OTHER PUBLICATIONS

Madge, R., et al., "In Search of the Optimum Test Set—Adaptive Test Methods for Maximum Defect Coverage and Lowest Test Cost", Proceedings of International Test Conference (ITC), 2004, pp. 203-212.

(Continued)

*Primary Examiner* — Arleen M Vazquez
*Assistant Examiner* — Lee Rodak

(57) ABSTRACT

A semiconductor test system includes test head pins; per-pin resources which are connectable to the test head pins on a one-to-one basis; shared resources, each of which is connectable to one of the test head pins; a tester controller for controlling the per-pin resources and the shared resources; and a tabular-form test plan including: a first column for specifying a measurement function that uses at least one of the per-pin resources and the shared resources; and at least one second column for specifying input and output parameters of the measurement function, the tabular-form test plan further including program rows, the tabular-form test plan being executed by the tester controller, the tabular-form test plan further including a third column for specifying how rows that are executed by asynchronous parallel execution are to be grouped.

11 Claims, 22 Drawing Sheets

(56) References Cited

U.S. PATENT DOCUMENTS

| | | | | |
|---|---|---|---|---|
| 6,557,128 | B1* | 4/2003 | Turnquist | G01R 31/31908 714/724 |
| 6,631,340 | B2 | 10/2003 | Sugamori et al. | |
| 6,780,660 | B2 | 8/2004 | Hamamura et al. | |
| 2004/0059972 | A1 | 3/2004 | Khoche | |
| 2006/0195747 | A1 | 8/2006 | Pramanick et al. | |
| 2007/0132477 | A1* | 6/2007 | Balog | G01R 31/2894 324/762.01 |
| 2007/0216435 | A1* | 9/2007 | Iguchi | G01R 31/31924 324/762.01 |
| 2013/0006567 | A1* | 1/2013 | Horn | G01R 31/31907 702/108 |
| 2014/0237291 | A1* | 8/2014 | Elston | G06F 11/26 714/25 |

OTHER PUBLICATIONS

Hess, C., et al., "Device Array Scribe Characterization Vehicle Test Chip for Ultra Fast Product Wafer Variability Monitoring", Proceedings of IEEE Int. Conference on Microelectronic Test Structures, vol. 20, Mar. 2007.

Agilent Technologies, "The Agilent 4070|300: Total Parametric Measurement Solution", Oct. 23, 2003.

English abstract of CN1784609, published Jun. 7, 2006.

English abstract of TWI287639, published Oct. 1, 2007.

English abstract of TWI389033, published Mar. 11, 2013.

Notice of Allowance dated Nov. 11, 2015 in Taiwanese Patent Application No. 102144022 (Unofficial/non-certified translation provided by foreign agent included).

* cited by examiner

FIG. 4

| # | Module Name | Device Name | Sequence | Algorithm | INPUT | Terminal | Output |
|---|---|---|---|---|---|---|---|
| 1 | Module A | TR1 | 1 | IOFF2 | Vd=0.90,Vg=1.0,Compl=0.1, f_range=5.0,m_range=1.0 | G=1,D=2,S=3,Sub=4 | Id1 |
| 2 | | TR2 | 1 | IOFF2 | Vd=0.45,Vg=1.2,Compl=0.1, f_range=5.0,m_range=1.0 | G=5,D=6,S=7,Sub=8 | Id2 |
| 3 | | TR3 | 1 | IOFF2 | Vd=0.05,Vg=0.9,Compl=0.1, f_range=5.0,m_range=1.0 | G=9,D=10,S=11,Sub=12 | Id3 |
| 4 | | | | | | | |
| 5 | Module B | TR4 | 2 | IOFF2 | Vd=0.90,Vg=1.0,Compl=0.1, f_range=5.0,m_range=1.0 | G=1,D=2,S=3,Sub=4 | Id4 |

FIG.5

```
void IOFF2(vector<double> Vd, vector<double> Vg, vector<double>
compl, vector<int> D, vector<int> G, vector<double> f_range,
vector<double> m_range, vector<int> S, vector<int> Sub,
vector<double> &Id)
{
   connect_pin(PSMU, D);
   connect_pin(PSMU, G)
   connect_pin(PSMU, S);
   connect_pin(PSMU, Sub);
   force_v(D, Vd, f_range, compl);
   force_v(G, Vg, f_range, compl);
   force_v(S, 0.0, f_range, compl);
   force_v(Sub, 0.0, f_range, compl);
   measure_i(D, Id, m_range);
   disable_port_all();
   disconnect_all();
}
```
⎫ 3202

FIG. 6

| # | Module Name | Device Name | Algorithm | Input | Pad Number | Output |
|---|---|---|---|---|---|---|
| 1 | Module A | TR1 | IOFF | Vd=0.90,Vg=1.0,Compliance=0.1, force_range=5.0,measure_range=1.0 | G=1,D=2,S=3,Sub=4 | Id1 |
| 2 | | TR2 | IOFF | Vd=0.45,Vg=1.2,Compliance=0.1, force_range=5.0,measure_range=1.0 | G=5,D=6,S=7,Sub=8 | Id2 |
| 3 | | TR3 | IOFF | Vd=0.05,Vg=0.9,Compliance=0.1, force_range=5.0,measure_range=1.0 | G=9,D=10,S=11,Sub=12 | Id3 |
| 4 # | | | | | | |
| 5 | Module B | TR4 | IOFF | Vd=0.05,Vg=0.9,Compliance=0.1, force_range=5.0,measure_range=1.0 | G=1,D=2,S=3,Sub=4 | Id4 |
| 6 | | | | | | |
| 7 | | | | | | |
| 8 | | | | | | |
| 9 | | | | | | |
| 10 | | | | | | |

Spec Name: SAMPLE A — 602
604 — Algorithm 610
606 — Spec Type: Test
612, 614
sample A
Spec Edit Tool Column Preference
600
□ Edit Description

FIG.7

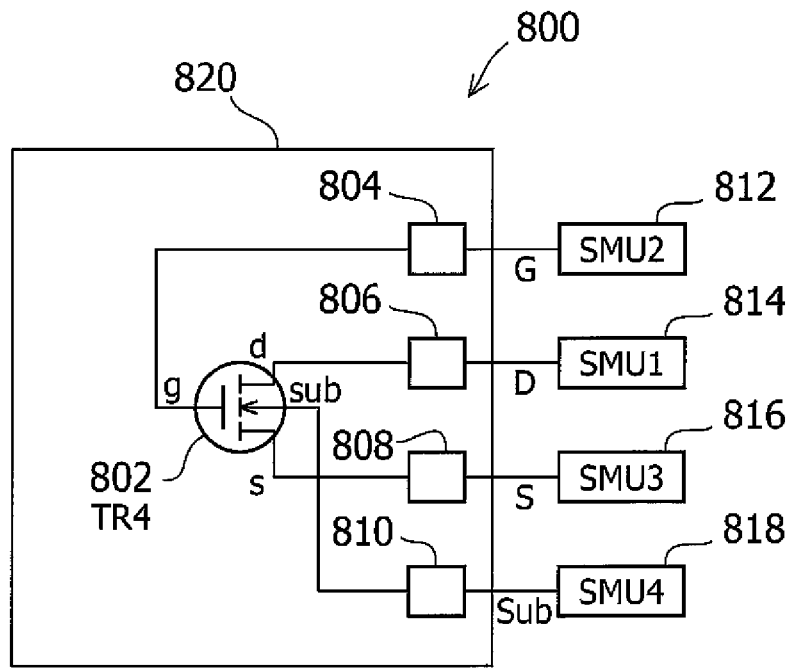

FIG.8

```
void IOFF(double Vd, double Vg, double compliance,
          double force_range, double measure_range,
          int D, int G, int S, int Sub, double *Id)       } 702
{
   connect_pin(SMU1, D);
   connect_pin(SMU2, G)
   connect_pin(SMU3, S);
   connect_pin(SMU4, Sub);
    force_v(D, Vd, force_range, compliance);
    force_v(G, Vg, force_range, compliance);
    force_v(S, 0.0, force_range, compliance);
    force_v(Sub, 0.0, force_range, compliance);
    measure_i(D, Id, measure_range);
    disable_port_all();
    disconnect_all();
}
```

FIG.9

| Module Name | Device Name | Parallel Test Attribute | Sequence | | |
|---|---|---|---|---|---|
| | | | Measurement Function Name | Setting | Connection |
| MA | TR1 | PT_SCHED_BEGIN | Ids | Vd=0.1 | G=1,D=2,S=3,W=4 |
| | | | Idoff | Vd=5 | G=1,D=2,S=3,W=4 |
| | TR2 | PT_SCHED_END | Ids | Vd=0.1 | G=5,D=6,S=7,W=8 |
| | | | Idoff | Vd=5 | G=5,D=6,S=7,W=8 |
| | TR3 | PT_SCHED_BEGIN | Ids | Vd=0.1 | G=9,D=10,S=11,W=12 |
| | | | Idoff | Vd=5 | G=9,D=10,S=11,W=12 |
| | TR4 | PT_SCHED_END | Ids | Vd=0.1 | G=13,D=14,S=15,W=16 |
| | | | Idoff | Vd=5 | G=13,D=14,S=15,W=16 |
| MB | TR1 | | Ids | Vd=0.1 | G=1,D=2,S=3,W=4 |

FIG.10

| # | Module Name | Device Name | Algorithm | Input | Pad Number | Output |
|---|---|---|---|---|---|---|
| 1 | | | | | | |
| 2 | Module A | TR1 | | | | |
| 3 | | | LET | i=0 | | |
| 4 | | | REPEAT | | | |
| 5 | | | LET | i=i+1 | | |
| 6 | | | IOFF | Vd=2.0,Vg=1.0,Compliance=0.1,force_range=5.0,measure_range=1.0 | G=1,D=2,S=3,Sub=4 | Ioff_current |
| 7 | | | UNTIL | i>10 | | |
| 8 | | | IF | IOFF.Ioff_current>2n | | |
| 9 | | | VTH | | | |
| 10 | | | ELSE IF | IOFF.Ioff_current>1n | | |
| 11 | | | LET | Flag=1 | | |
| 12 | | | ELSE | | | |
| 13 | | | LET | Flag=2 | | |
| 14 | | | END IF | | | |
| 15 | | TR2 | | | | |
| 16 | | | LET | i=0 | | |
| 17 | | | ... | | | |
| 18 | | | | | | |

Spec Name: SAMPLE B    Spec Type: Test    ☐ Edit Description

| # | Device Name | Dispatch Label | Dispatcher | Dispatcher Input | Dispatcher Terminal | Algorithm | Input | Terminal | Output |
|---|---|---|---|---|---|---|---|---|---|
| 1 | TR1 | D1 | Arry_Ctl2 | addr=1, vdd=2 | adT1=101, adT2=102, adT3=103, vddT=104 | IOFF2 | Vd=2.0,Vg=1.0, Compl=0.1, f_range=5.0, m_range=1.0 | G=1, D=2, S=3, Sub=4 | Ioff_c |
| 2 | TR2 | D1 | Arry_Ctl2 | addr=2, vdd=2 | adT1=101, adT2=102, adT3=103, vddT=104 | IOFF2 | Vd=2.0,Vg=1.0, Compl=0.1, f_range=5.0, m_range=1.0 | G=1, D=2, S=3, Sub=4 | Ioff_c |
| 3 | TR3 | D1 | Arry_Ctl2 | addr=3, vdd=2 | adT1=101, adT2=102, adT3=103, vddT=104 | IOFF2 | Vd=2.0,Vg=1.0, Compl=0.1, f_range=5.0, m_range=1.0 | G=1, D=2, S=3, Sub=4 | Ioff_c |
| ... | ... | ... | ... | ... | ... | ... | ... | ... | ... |
| 100 | TR100 | D1 | Arry_Ctl2 | addr=100, vdd=2 | adT1=101, adT2=102, adT3=103, vddT=104 | IOFF2 | Vd=2.0,Vg=1.0, Compl=0.1, f_range=5.0, m_range=1.0 | G=1, D=2, S=3, Sub=4 | Ioff_c |

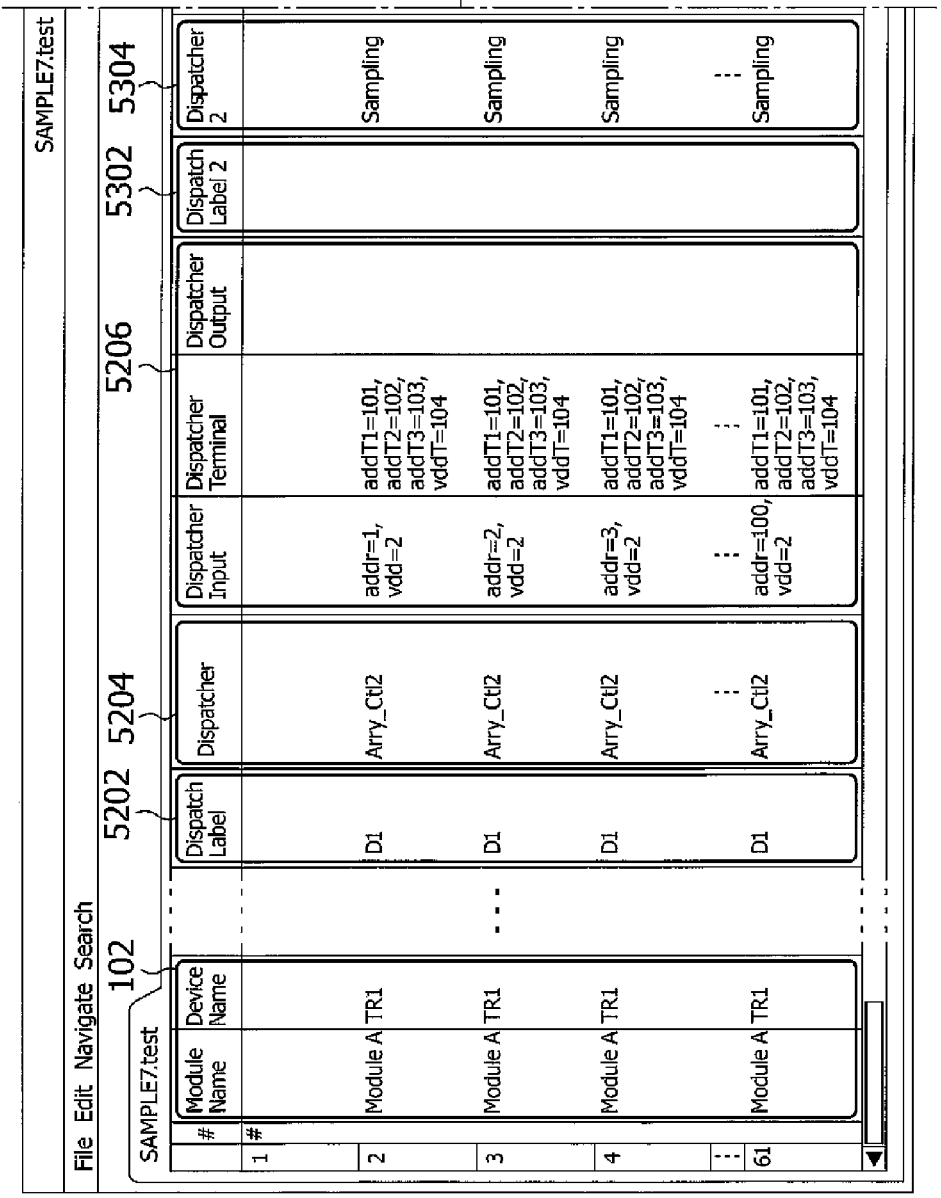

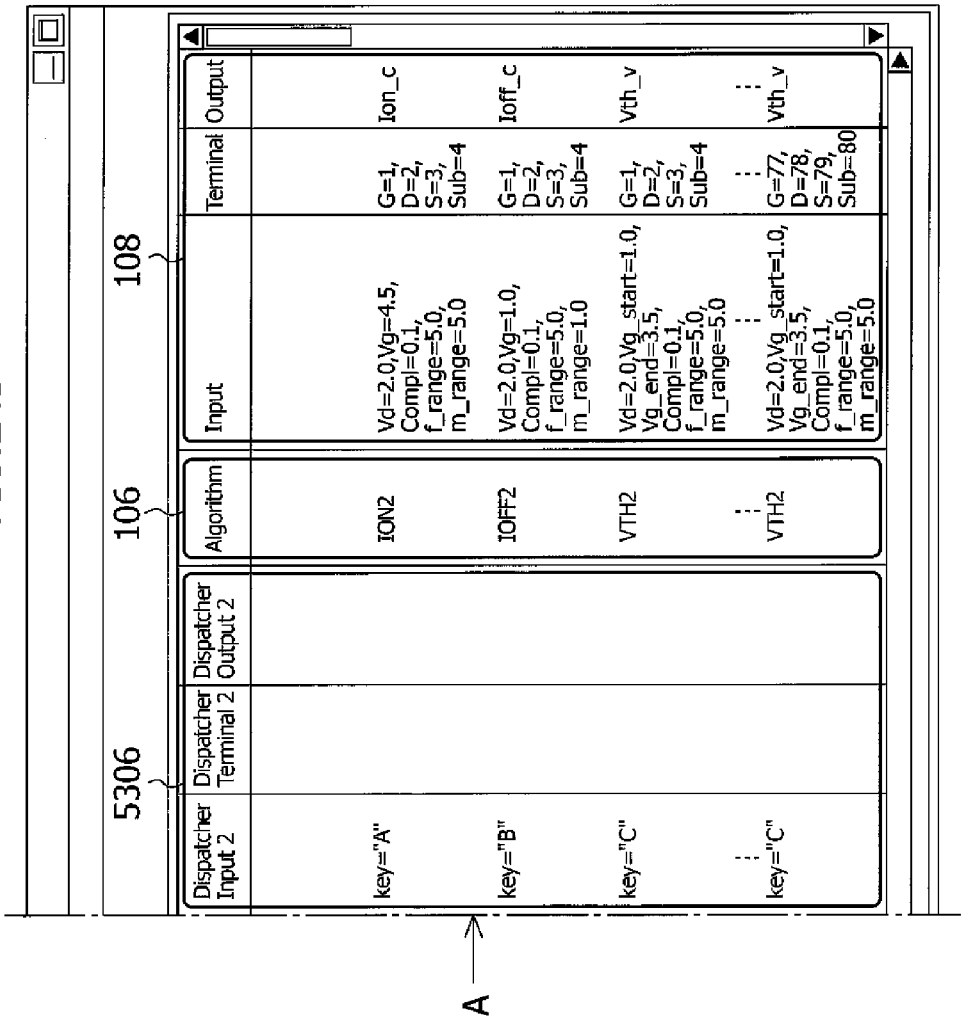

TEST SYSTEM FOR IMPROVING THROUGHOUT OR MAINTENANCE PROPERTIES OF SEMICONDUCTOR TESTING

BACKGROUND OF THE INVENTION

1. Field of the Invention

The invention relates to semiconductor test systems and methods, and more particularly, to semiconductor test systems and methods with improved maintenance properties and throughput.

2. Related Art

Various semiconductor testing technologies have been developed in order to improve the throughput of a test of semiconductor devices. Semiconductor test systems have been developed using test beds on which multiple devices can be connected and tested in parallel. The devices under test (DUTs) are provided with test pads at which a signal may be output, or from which a signal level may be input. The systems may execute test plans that program the signals to be applied to the devices and the signals that are to be read from the devices.

In an example of a semiconductor parametric test system that has been developed for use in process management of yield and transistors' electrical properties in the manufacture of integrated circuits, a test environment is included for improving software productivity. The test environment uses a tabular-form test plan, and program code provided as functions written in a general-purpose programming language or the like. The system executes test plans that are prepared by users and provided to the system in a table. The test plans are executed row-by-row where each row defines a function to be performed and information used by the function. The functions and information used by the functions are indicated as entries in the row according to the columns that define the function and associated information.

The semiconductor parametric test system enables the testing of devices in groups. A test element group (TEG) is defined as the measurement object of the test plan. Devices that belong to the TEG are setup for testing in a test environment that provides access to the test pads on the devices. The test determiners how the test pads are to be connected to a source measurement unit ("SMU"), which is controlled under program control by a processor. The connection from the test pad to the SMU is typically made by probing the device using a wafer prober. Each SMU is a measuring instrument capable of voltage application and current measurement, or of current output and voltage measurement. SMUs may be programmed to function by limiting current during voltage application as well as of limiting voltage during current output.

An example of a test plan based on the test environment of the semiconductor parametric test system that enables testing of devices in groups is illustrated in FIG. 6. The test plan shown in FIG. 6 is an example test plan for testing a TEG 820 depicted as the measurement object in the measurement block diagram in FIG. 7.

Referring to FIG. 7, the TEG 820 includes a first pad 804, a second pad 806, a third pad 808, and a fourth pad 810. The TEG 820 also includes a transistor TR4 802, which is an FET having a gate terminal 'g' connected to the first pad 804 on the TEG 820. The first pad 804 is connected to an SMU2 812, which has a port labeled 'G.' The transistor TR4 802 has a drain terminal 'd' connected to the second pad 806 on the TEG 820. The second pad 806 is connected to an SMU1 814, which has a port labeled 'D.' The transistor TR4 802 has a source terminal 's' connected to the third pad 808 on the TEG 820. The third pad 808 is connected to an SMU3 816, which has a port labeled 'S.' The transistor TR4 802 has a substrate (bulk) terminal 'sub' connected to the fourth pad 810 on the TEG 820. The fourth pad 810 is connected to an SMU4 818, which has a port labeled 'Sub.' The respective physical connections from the SMUs 812-818 to the pads 804-810 are established by probing with the use of a wafer prober or the like.

The semiconductor parametric test system performs tests according to test plans prepared by users. The test plans have columns defining parameters and functions to be performed in a step of the test plan. For example, a column is included for identifying a module name for a grouping of circuits or devices that have pads to be probed together in one touchdown. Another column defines a function or measurement function to be executed during a particular step in the test plan. The row determines the step in the test plan, and the measurement function entry in the measurement function column identifies the particular program unit or units that are called for execution. The measurement functions are typically provided in a function library that is part of the software operating on the system. The measurement functions are typically written in a compiled programming language, such as the 'c' programming language. An example of how the rows and columns in a test plan table are used to execute the test plan is described with reference to FIG. 6.

Referring to FIG. 6, a test plan input window 600 has a test plan input area 614, where each row includes one measurement function, and the input and output parameter settings to be used with the function. The test plan 600 of FIG. 6 is configured as a program in the form of a table that executes an aggregation of one or more rows as steps in the program. The first column of the test plan 600 in FIG. 6 is indicated as being a '#' column. The '#' column allows a user to "comment out" a row by entering an "#" in the '#' column for the selected row. When an '#' is entered in the '#' column, that row is not executed. The second and third columns, collectively indicated by 602, are used for symbol information used to identify location information of a measurement object on a semiconductor wafer. In the example illustrated in FIG. 6, a module name "Module B" is an entry used to identify the TEG 820 of FIG. 7. The example illustrated in FIG. 6 has the module name "Module A," which refers to another TEG (not shown) as an entry in the second column, which is a module name column at 602. The test plan table 600 also has a device name "TR4," which refers to the transistor TR4 802, entered in the device name column under the module name, "Module B," of the TEG 820 of FIG. 7. Device names "TR1", "TR2", and "TR3" are entered in the device name column under the module name, "Module A."

The test plan may include other columns, such as columns for providing input and output parameters, which are provided as arguments for function calls that invoke the measurement function identified in the measurement function column. Examples of the type of information that may be provided as input or output parameters include: values of electrical settings such as voltage or current, values of settings with terminal connection information, and pointers or memory storage indicators for storing data generated as output by the measurement function. The electrical settings provide the voltage and current values to be applied to the test pads in functional terms. For example, if the device tested is a transistor, the electrical settings would state values for the gate and the drain or source. The terminal information that may be provided as input parameters defines pads to be used for connections having a specific function. For example, a pad may be connected to the gate of a transistor being tested, or to the drain or source of the transistor.

The test plan 600 in FIG. 6 illustrates how measurement functions and their arguments are specified. The name of a measurement function or function may be entered in the "function" column 604. The measurement function entered in column 604 identifies a function for measuring a desired parameter of a measurement object that is specified in the column 602. In this example, function name 'IOFF' at 610 is entered in the measurement function column as a measurement function name. The function IOFF is, as described later with reference to FIG. 8, a measurement function for measuring a current that flows into a drain terminal of an FET device when specified voltages are applied to a gate terminal and a drain terminal of the FET device, and 0 (zero) V. is applied to a source terminal and a substrate terminal of the FET device. According to the measurement function entered in the measurement function column of this test plan, one FET identified in the device name column 602 of the test plan connected to a terminal specified in the pad number column in 606 of the test plan is measured by calling the measurement function 'IOFF' once.

The fifth, sixth, and seventh columns, which are collectively indicated by reference number 606 in FIG. 6 are used to specify input and output parameters for each measurement function specified in the measurement function column 604. The specified input and output parameters are arguments of the measurement function and the data specified in the arguments is used in function calls of the measurement function. In the example depicted in FIG. 6, the fifth column is an input column used for entering a list of values of mainly electrical settings information, such as voltage and current that does not include terminal connection information. The sixth column is a pad number column used for entering a list of values of settings information about terminal connection of a measurement object. The seventh column is an output column used for entering the label of a memory area for storing output data.

FIG. 6 illustrates examples of values for entry in the input column, pad number column and output column at 612. Values entered in the input column are to be passed to the measurement function 'IOFF' as a part of the input information on the measurement of TR4 that does not include terminal connection. The values entered in the input column include values for $V_d$ (value of a voltage applied to the drain), $V_g$ (value of a voltage applied to the gate), and a compliance value (limited current value). Values entered in the pad number column are values that define pad terminals of device TR4 that are to be connected to the gate connection terminal G, the drain connection terminal D, the source connection terminal S, and the substrate connection terminal Sub. In the output column, "Id4" is entered as the name of a memory area for storing an output of the measurement function 'IOFF' in association with an output parameter for the measurement function 'IOFF.' FIG. 8 is an example of the function 'IOFF' written in the 'c' programming language. The 'IOFF' function call definition includes a list of arguments 702 that are passed to the IOFF function when called. The arguments listed the list of arguments 702 correspond to the input parameters specified in the input column, the pad number column, and the output column at 612 in FIG. 6.

A tabular-form test plan of the type described above provides an environment that enables a user to program a test easily and intuitively. The user configures a test plan in a programming environment that consists of two layers in the form of a tabular-form test plan and a measurement function written in a general-purpose programming language. The test environment, which allows programming in a general-purpose programming language, also provides an environment compatible with any kind of programming. This type of test environment uses simple functions, but is limited in the tests that can be performed. This test environment is also not suitable for intricate and sophisticated program flow control that relies heavily on the use of conditional branching and repetition, nor for the programming of a function for a test that is more sophisticated than one prepared as a standard specification, or the like.

Another example of a semiconductor test system partially parallelizes a semiconductor parametric test. A test plan with parallel test attributes would include a parallel test attribute column in which labels are provided for specifying the start and end of parallelization. With the range of parallelization specified, a tester interprets the specified range, and generates threads so that tests are executed in a plurality of specified ranges in parallel to one another. The threads are each a series of steps in the test plan within the specified parallelization range performed for indicated devices in the TEG. An example of a test plan that performs parallelization is shown in FIG. 9. The test plan in FIG. 9 includes a parallel test attribute column 902 for entering labels, such as PT_SCHED_BEGIN and PT_SCHED_END, that define the start and end of parallelization. Two ranges of parallelization are shown in FIG. 9. The first range of parallelization 904 identifies a range of test steps for testing devices TR1 and TR2. A second range of parallelization 906 identifies a second range of test steps for testing devices TR2 and TR4.

However, this method, too, requires advanced knowledge and programming skill for semiconductor testing and test programs. This method also requires knowledge and performance of debugging.

Another example of a testing environment that uses a tabular-form test plan includes conditional branching processing using an IF statement, and repetition processing using a REPEAT statement. A LET statement may be included to assign a value to a parameter. Statements for invoking conditional processing may be added, for example, in the measurement function column described above.

An example of a test plan 2600 that uses conditional processing statements is illustrated in FIG. 10. The test plan 2600 follows a format similar to the test plan data entry area 2614 illustrated in FIG. 9. The conditional processing statements are entered in the measurement function column. FIG. 10 shows a REPEAT statement at 2610 to indicate that the rows that follow up until an UNTIL statement at 2616 are to be repeated until the condition for terminating the repetition specified in the input column for the UNTIL statement at 2618 is met. One of the statements in the range between REPEAT at 2610 and UNTIL at 2618 is the 'IOFF' function at 2612. The argument data at 2613 specified in the input column, pad number column, and the output column is provided in the repetition. The use of an IF statement at 2620 is provided in rows following the UNTIL statement at 2616. The condition for processing the rows that follow the IF statement at 2620 is indicated in the input column at 2622. The processing to be performed when the IF condition is met is provided in the next row at 2624, with corresponding arguments at 2626. An ELSEIF statement at 2628 is in the following row with data defining the ELSEIF condition at 2630. An ELSE statement at 2632 is shown around statements that set flags. An ENDIFF statement at 2634 defines the end of the IF-ELSEIF-ELSE blocks.

Test plans that include conditional processing statements have the effect of lengthening the test plan by the addition of rows that have a conditional processing statement in the measurement function column. The lengthening of the test plan and the addition of more rows makes a test plan less readable and more difficult to understand. In some test plans, numerous measurements are often repeated for statistical processing of measured values at different measurement conditions. Numerous measurements also make test plans more difficult to read or understand. Some test plans for certain types of TEGs also require steps for pre-processing and post-processing for a given measurement function. For example, a test plan may perform a measurement function for measuring the current output at a drain terminal of an FET device when specified voltages are applied to a gate terminal and a drain terminal of the FET device, while 0 (zero) V. is applied to a source terminal and a substrate terminal of the FET device. Before the measurement function is called, a function that sets the address of a desired TEG may be executed as pre-processing for a hundred TEGs. A function for resetting the voltage $V_{dd}$ at the drain terminal may also be called after the measurement function as post-processing. Such pre- and post-processing steps further lengthen and complicate the display of test plans making them more difficult to read and understand. Test plans that are difficult to read or understand have the effect of complicating the tasks of debugging and correcting the test plan.

Test plans of the type described above also execute using an interpreter to call a measurement function in the measurement function column and to execute a command. Interpreted programs tend to execute slower in speed than compiled programs. The slower speed compared to the execution of a compiled program is particularly noticeable when repetition and conditional branching are repeated.

The execution speed could be improved by including branching, repetition, and other similar functions in a compiled measurement function. However, this would make such test plans inflexible since changes cannot be made after the program is completed. Another problem is that the maintenance of such test plans would have to be performed by a semiconductor engineer with a certain degree of advanced programming skill capable of comprehending the details of a measurement function. This requirement adds to the burden of test plan maintenance.

As has been described, the miniaturization and high degree of integration achieved in the semiconductor manufacturing process in recent years has resulted in the need to test an ever-increasing number of devices, the need for improvement in the throughput of the testing, and the need for an accompanying improvement in the maintenance properties of the test.

SUMMARY OF THE INVENTION

In view of the above, a semiconductor test system is provided, the semiconductor test system including a plurality of test head pins; a plurality of per-pin resources connectable to the plurality of test head pins on a one-to-one basis; a plurality of shared resources, each of which is connectable to one of the plurality of test head pins; and a tester controller for controlling the plurality of per-pin resources and the plurality of shared resources. The tester controller is configured to execute machine-executable instructions in accordance with a user-generated tabular form test plan. The user-generated tabular form test plan comprises a plurality of program rows each row defining a test plan step and a plurality of columns defining information for performing the test plan step. The plurality of columns includes a measurement function column for specifying a measurement function that uses at least one of the plurality of per-pin resources and the plurality of shared resources; at least one input and output column for specifying input and output parameters of the measurement function; and an asynchronous parallel grouping column for specifying how rows that are executed by asynchronous parallel execution are to be grouped. The tester controller is configured so that groups of program rows different from one another according to entries in the asynchronous parallel grouping column are executed so as to start asynchronous parallel execution concurrently.

In another embodiment, the semiconductor test system includes a plurality of test head pins; a plurality of per-pin resources connectable to the plurality of test head pins on a one-to-one basis; a plurality of shared resources, each of which is connectable to one of the plurality of test head pins; and a tester controller for controlling the plurality of per-pin resources and the plurality of shared resources. The tester controller is configured to execute machine-executable instructions in accordance with a user-generated tabular form test plan. The user-generated tabular form test plan comprises a plurality of program rows each row defining a test plan step and a plurality of columns defining information for performing the test plan step. The plurality of columns includes a measurement function column for specifying a measurement function that uses at least one of the plurality of per-pin resources and the plurality of shared resources; at least one input and output column for specifying input and output parameters of the measurement function; and a synchronous parallel grouping column for specifying how rows that are executed by synchronous parallel execution are to be grouped, where each of a plurality of groups grouped as specified in the synchronous parallel grouping column comprise only rows that have the same measurement function to be executed by synchronous parallel execution.

In another embodiment, the semiconductor test system includes a plurality of test head pins; a plurality of per-pin resources connectable to the plurality of test head pins on a one-to-one basis; a plurality of shared resources, each of which is connectable to one of the plurality of test head pins; and a tester controller for controlling the plurality of per-pin resources and the plurality of shared resources. The tester controller is configured to execute machine-executable instructions in accordance with a user-generated tabular form test plan. The user-generated tabular form test plan comprises a plurality of program rows each row defining a test plan step and a plurality of columns defining information for performing the test plan step. The plurality of columns includes a measurement function column for specifying a measurement function that uses at least one of the plurality of per-pin resources and the plurality of shared resources; at least one input and output column for specifying input and output parameters of the measurement function; and a first dispatch column configured to perform program flow control with respect to the measurement function of the first column, and at least one dispatch input/output parameter column for specifying input and output parameters of the first dispatch function.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, reference numerals designate corresponding parts throughout the different views.

FIG. 4 depicts an example of the test plan shown in FIG. 3 that implements synchronous parallel execution.

FIG. 5 is an example of source code for an example of a measurement function that may be used in the test plan in FIG. 3.

FIG. 6 shows a window displaying another example of a test plan.

FIG. 7 is a block diagram of measurement using a measurement object in FIG. 6.

FIG. 8 is an example of source code for a measurement function for use in the test plan shown in FIG. 6.

FIG. 9 is another example of the test plan in FIG. 6 that implements parallel test attributes.

FIG. 10 is another example of the test plan in FIG. 6 that implements conditional processing and repetition processing.

FIG. 20 depicts a window displaying the test plan of FIG. 3 to illustrate operation of dispatch operation control.

FIG. 23 is an example of a test plan in which a dispatch function uses an example of a variable-length array argument of a type illustrated in Table 23 is used in the test plan of FIG. 20.

FIGS. 24A and 24B illustrate an example of a test plan that incorporates the function of a dispatch function of Table 22 into the test plan of FIG. 23.

DETAILED DESCRIPTION

Figure 1:
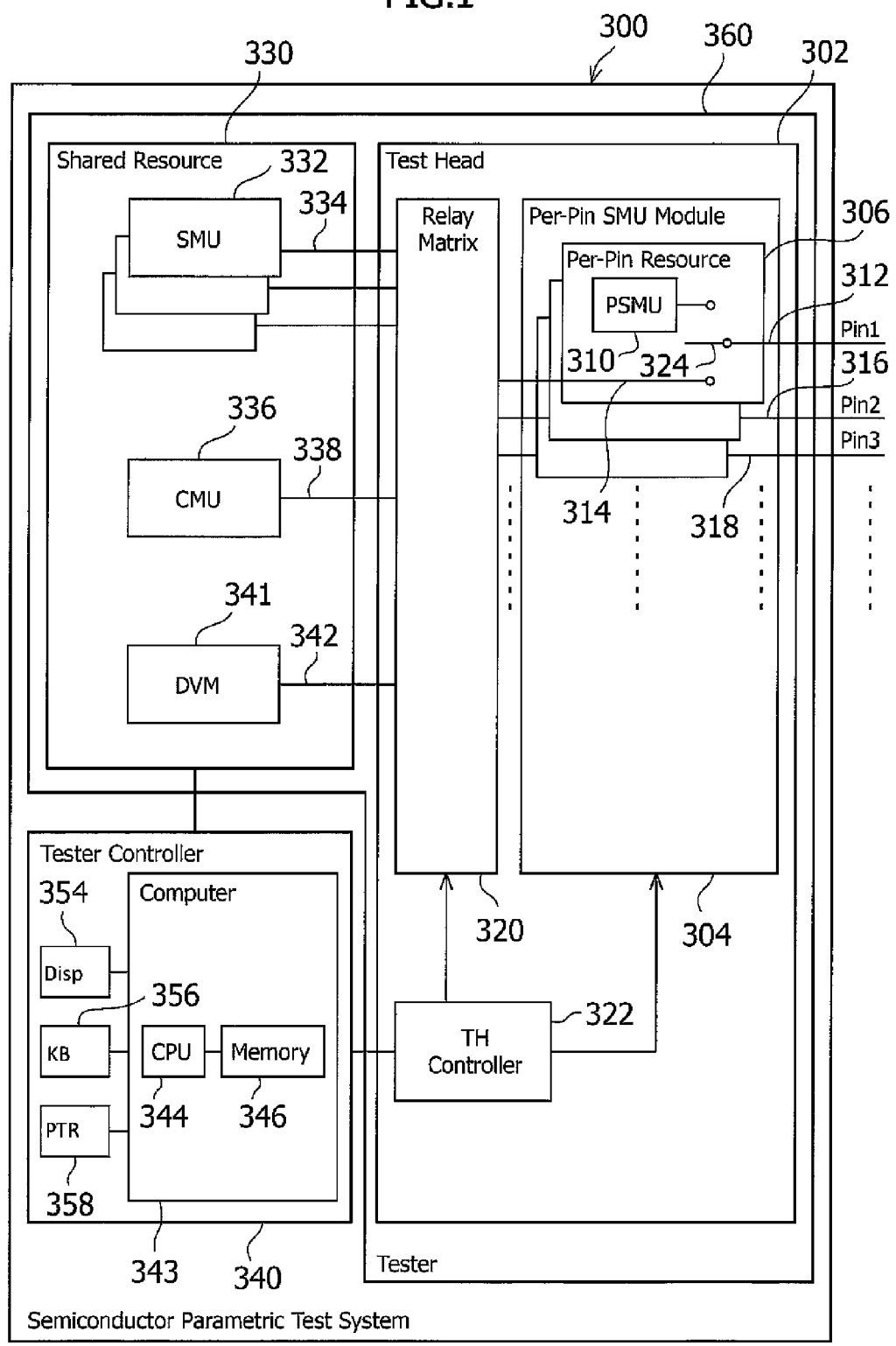
FIG. 1 is a block diagram of an example of a semiconductor parametric test system.

FIG. 1 is a block diagram of an example implementation of a semiconductor parametric test system 300. The semiconductor parametric test system 300 includes a tester 360 for executing a test on a DUT (not shown) and a tester controller 340 for controlling the tester 360. The tester 360 includes a shared resource block 330 and a test head 302. The shared resource block 330 includes a plurality of source monitor units (SMUs) 332, a capacitance measurement unit (CMU) 336, and a digital volt meter (DVM) 341, which is capable of measuring voltage, current, and resistance.

The test head 302 includes a plurality of test head pins, a per-pin SMU module 304, a relay matrix 320, and a test head controller 322. The test head pins shown in FIG. 1 are identified as Pin1 312, Pin2 316, and Pin3 318. Additional test head pins up to a suitable number for system requirements are not shown, but indicated by ellipses. The plurality of test head pins is used to make connections to DUTs.

The test head controller 322 is configured to control operation of the relay matrix 320 and the per-pin SMU module 304. The per-pin SMU module 304 includes a plurality of per-pin resources 306, each configured to be capable of connecting to a corresponding one of the test head pins. The test head controller 322 controls the relay matrix 320 to establish connections between the shared resource block 330 and the respective per-pin resources 306 in the per-pin SMU module 304. The relay matrix 320 uses a plurality of signal lines 334 from the plurality of SMUs 332, a signal line 338 from the CMU 336, and a signal line 342 from the DVM 341 from the shared resource block 330 to connect to a plurality of signal lines 314 that connect to the respective per-pin resources 306 in the per-pin SMU module 304. Each per-pin resource 306 includes a per-pin SMU (PSMU) 310. Each per-pin resource 306 is controlled by the test head controller 322 to trigger a relay 324 to connect a test head pin (Pin1 312 in this example of FIG. 1) to either a signal line of the PSMU 310 or a signal line 314 from the relay matrix 320.

The tester controller 340 is connected to the test head controller 322 and to the resources within the shared resource block 330. The tester controller 340 includes a computer 343 connected to a display 354, a keyboard 356, and a pointing device 358 (for example, a mouse). The computer 343 includes a memory 346 and a central processing unit (CPU) 344 to execute various types of computing processing. The memory 346 includes one or more storage devices such as a read only memory (ROM), a random access memory (RAM), a flash memory, a hard disk drive (HDD), a CD and DVD drive, a floppy drive, and various memory card drives. Data and programs used in the processing of the CPU 344 are stored in the memory 346. The tester controller 340 can be configured with network connectivity resources to connect to a network such as the Internet.

Figure 2:
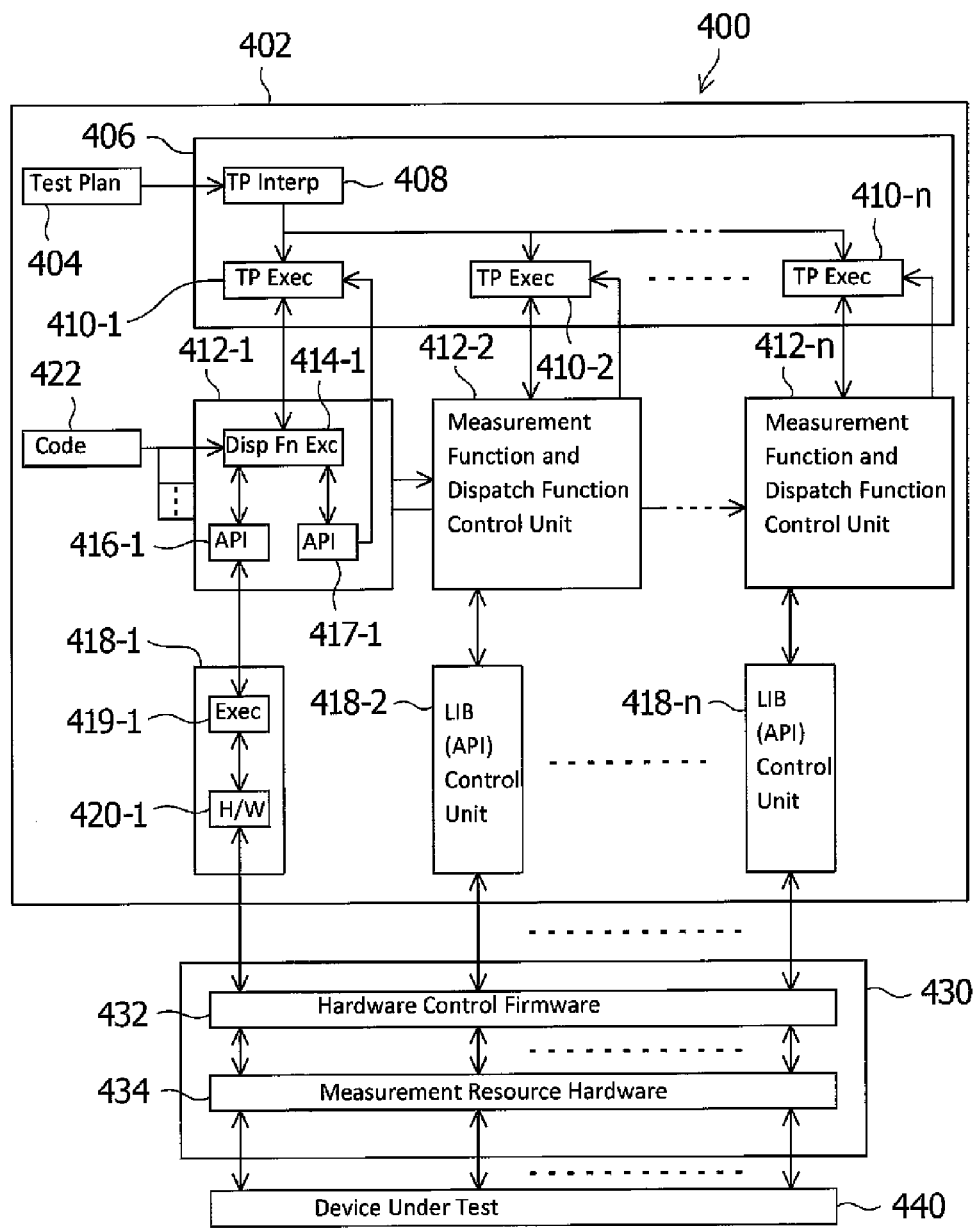
FIG. 2 is a block diagram of software for executing a test plan by the test system of FIG. 1.

FIG. 2 is a software block diagram 400 illustrating the execution of a test plan by the test system 300 of FIG. 1. A tester controller 402 in FIG. 2 includes a test plan control unit 406, a measurement function and dispatch function control unit 412, and a library (API) control unit 418. The tester controller 402 refers to a test plan 404 and to a measurement function and dispatch function code 422. The test plan 404 and the measurement function and dispatch function code 422 are stored in memory and made available to be interpreted and executed. The tester controller 422 outputs control information resulting from the processing of the test plan 404 and the measurement function and dispatch function code 422 to a tester 430. The tester controller 402 and the tester 430 of FIG. 2 correspond respectively to the tester controller 340 and the tester 360 of FIG. 1.

The test plan 404 is implemented in tabular form with rows representing steps to be performed and columns defining information used to perform the steps. The measurement function and dispatch function code 422 is implemented as a compiled system of functions to be called during execution of the rows in the test plan 404. The measurement function and dispatch function code 422 includes an interface to a library (API) capable of handling parallel execution requests. A "library (API)" indicates a set of functions accessible using an Application Programming Interface ("API"), which is well-known to those of ordinary skill in the art.

The test plan control unit 406 is configured to use parallel execution. The measurement function and dispatch function control units 412 and the library (API) control units 418 are configured to perform synchronous parallel execution. Parallel execution is performed when specified by entries in the test plan 404. It is noted that the expression "parallel execution" as used herein refers to both a synchronous parallel execution function and an asynchronous parallel execution which are described below, unless otherwise stated.

The test plan control unit 406 includes a test plan interpreting unit 408, which interprets each row in the test plan 404. Based on the result of the interpretation, the test plan control unit 406 may generate multiple test plan execution units 410 (shown in FIG. 2 as 410-1 to 410-n). Each test plan execution unit 410-1 to 410-n forms an execution thread, and the number 'n' is a thread count, or the number of threads to be executed in parallel asynchronously. Each of the test plan execution units 410-1 to 410-n is a series of program steps capable of synchronous execution. Each test plan execution unit 410 executes a test plan allocated on a thread-by-thread basis one row at a time. The test plan execution units 410-1 to 410-n are generated by the test plan interpreting unit 408 according to entries in the test plan 404. During execution of a row, the test plan execution unit 410 transfers control to one of the measurement function and dispatch function control units 412 in order to call a measurement function or dispatch function specified in the row, and to receive a result from the function.

The measurement function and dispatch function control units 412 are provided on a thread-by-thread basis. The number of the measurement function and dispatch function control units 412 (shown in FIG. 2 as 412-1 to 412-n) generated is equal to the thread count n, which is the number of threads to be executed in parallel asynchronously. In each measurement function and dispatch function control unit 412-1 to 412-n, a call from the test plan execution unit 410-x that is associated with one of the threads is first received by a measurement function and dispatch function executing unit 414-x. The variable 'x' represents one of the threads from among the n threads executed in parallel. The measurement function and dispatch function code 422 in the memory is referred to, and control is transferred to, a dispatch function library (API) calling unit 417-x when the received call relates to a dispatch function. Control is transferred to a measurement function library (API) calling unit 416-x when the received call relates to a measurement function. The measurement function library (API) calling unit 416-x provides an interface capable of handling synchronous parallel execution requests.

The dispatch function library (API) calling unit 417-x returns control to the test plan execution unit 410-x in order to execute a library for a relevant dispatch function, and to execute a measurement function to be executed with the dispatch function. The measurement function library (API) calling unit 416-x transfers control to the associated library (API) control unit 418-x for the x-th thread in order to execute a library for a relevant measurement function. The library (API) control unit 418-x is a control unit capable of handling synchronous parallel execution requests. In the library (API) control unit 418-x, a call from the measurement function library (API) calling unit 416-x is received by a library (API) executing unit 419-x, and control is transferred next to hardware control firmware 432 in the tester 430 via a hardware control firmware calling unit 420-x. The hardware control firmware 432 controls measurement resource hardware 434 to supply given signals to a DUT 440 or to measure the DUT 440. The library (API) executing unit 419-x is an executing unit capable of handling synchronous parallel execution requests. The hardware control firmware calling unit 420-x is a calling unit capable of synchronous parallel execution. The hardware control firmware 432 is firmware capable of synchronous parallel execution.

An output value indicating the result of executing signal supply to or measurement of the DUT 440 is provided to a row of the test plan that is being executed when control is returned to the test plan execution unit 410-x, which is associated with the x-thread, following the opposite route. In the case of asynchronous parallel execution described later, as many threads as the number of procedures to be executed in the asynchronous parallel execution are generated and executed in parallel, and output values are provided to the test plan as a result.

In contrast, synchronous parallel execution, described below with reference to FIG. 4, does not involve generating threads that are to be executed in parallel. Instead, blocks capable of synchronous parallel execution are allocated a plurality of measurement resources for synchronous parallel execution. For example, synchronous parallel execution to be performed among a plurality of per-pin resources 306 or among a plurality of pieces of hardware capable of parallel execution in the shared resource. The blocks capable of synchronous parallel execution are controlled via the test head controller 322 and the per-pin SMU module 304 so as to operate in parallel concurrently. The result thereof is provided to the test plan as output values.

The test plan is thus executed one row at a time and the test system is controlled so that an output value indicating the result of the execution of the row is brought to a parameter area specified by the row.

The tabular form used to generate a test plan in the test system described above with reference to FIG. 1 and FIG. 2 is an expression form used in a domain-specific language (DSL). DSL is an expression form in a programming language designed for specific processing, or a specification description language. DSL includes a simple form input format enabling a user to input entries into the table, as well as a language for a specific purpose. The tabular form described herein is also known as a spreadsheet format, a ledger sheet input format, and a table input format.

Figure 3:
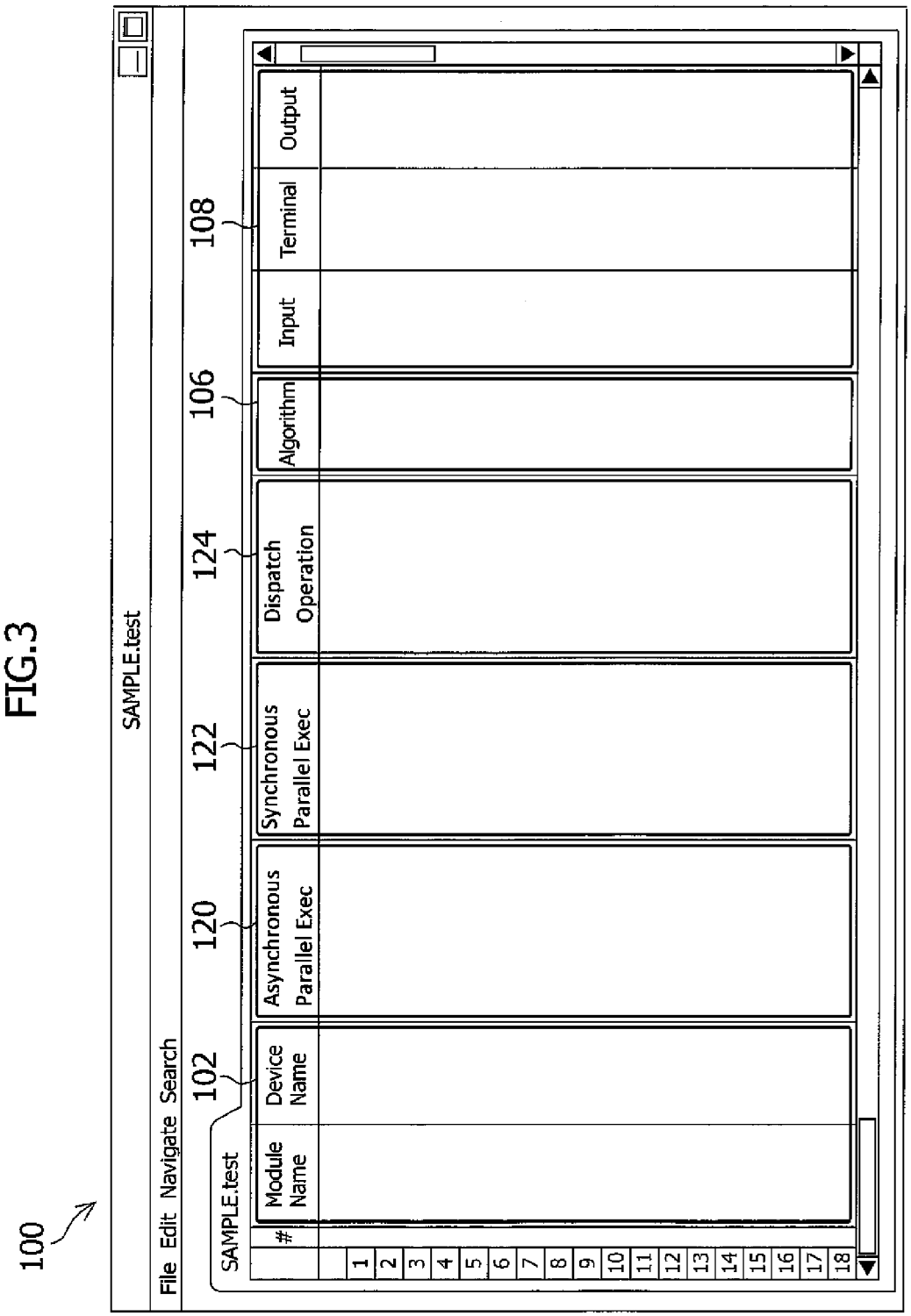
FIG. 3 is a schematic view of an example of a test plan configured for operation using the test system of FIG. 1.

FIG. 3 is an outline of a test plan input window 100 that may be displayed for a test plan that may be prepared to execute in the semiconductor parametric test system 300 described above with reference to FIGS. 1 and 2. The test plan input window 100 in FIG. 3 represents a form that may be used to enter information in rows and columns that generates a test plan. The test plan input window 100 includes a first column block 102 that includes a module name column and a device name column. A measurement function column 106 is used to specify a measurement function to be executed. A second column block 108 includes an input column for specifying input parameters that may be provided as input for a corresponding measurement function, a terminal column for specifying terminal information, and an output column for specifying information about an output parameter.

The test plan input window 100 includes an asynchronous parallel execution block 120, a synchronous parallel execution block 122, and a dispatch function operation block 124. The asynchronous parallel execution block 120 includes a column for specifying information used to control asynchronous parallel execution. The synchronous parallel execution block 122 includes a column for specifying information used to control synchronous parallel execution. The dispatch function operation block 124 includes a column for specifying information used to control dispatch operation.

The test plan input window 100 includes a module name column in the first column block 102 to identify a grouping of circuits or devices that can be measured in parallel at once.

Asynchronous parallel execution is understood herein to refer to a process of generating a plurality of threads for execution in parallel, and of executing the threads in parallel. The threads are executed independently of one another. That which is being executed in one thread may be completely different from that which is being executed in another thread. In principle, asynchronous parallel execution does not involve timing, or synchronizing, the execution of a step in one thread with the execution of a step in another thread. Asynchronous parallel execution defined as an execution format for executing heterogeneous execution objects in parallel. For example, asynchronous parallel execution may be used to execute a thread for operating a DUT with a PSMU and then measuring the DUT with a CMU, and another thread for processing another DUT only with an SMU which is a shared resource, where the threads execute in parallel.

Providing information in the asynchronous parallel execution block 120 as entries in the column for specifying information used to control the asynchronous parallel execution described above provides the user with control over asynchronous parallel execution. In addition, the task of debugging a test plan may be simplified by including entries specifying asynchronous parallel execution in the test plan.

Synchronous parallel execution is understood herein to refer to a parallel execution format for homogeneous execution objects. A synchronous parallel execution format is suitable for cases involving the use of measurement resources having the same function, and cases in which the operation sequence among measurement resources operating in parallel is the same. Synchronous parallel execution is a parallel execution mode where the control involves setting a plurality of pieces of hardware to execute in parallel from one thread, letting the pieces of hardware start operating concurrently, and waiting for the pieces of hardware to stop operating. This mode of parallel execution is synchronous in that measurement resources are executed basically at the same timing.

Dispatch operation control is understood herein to refer to a control structure that eliminates aspects of tabular-form test plans that make test plans less readable, and improves maintenance properties of the test plan. Dispatch operation control avoids the need for descriptions about program flow control, which maintains the readability of the test plan. Dispatch operation control improves maintenance properties by allowing the addition of a new layer that defines program flow control to the software structure on top of a measurement function layer.

A test plan may be composed by a user in which information is entered in the dispatch function operation block 124 in the column specifying information for the dispatch operation control. A dispatch function written in a general-purpose programming language is also provided. Intricate program flow control may thus be absorbed by entering a parameter related to the specified dispatch function in the dispatch function operation block 124. This further causes the test system to operate so that a parameter related to a measurement function that is written in the relevant row of the test plan is called in accordance with processing inside the dispatch function that has been called.

The format for a test plan shown in FIG. 3 provides a user with ways to include processing for program flow control in the test plan without disrupting the readability of the test plan.

The processing for program flow control may include, for example, subsidiary processing for measurement operation, such as conditional branching processing, repetition processing, and calling processing for various types of pre-processing or post-processing. For each measurement function, a parameter related to a dispatch function that is associated with the description of a parameter related to the measurement function may be entered in a test plan by adding a corresponding column to the dispatch function operation block 124. This avoids the need to add rows to the test plan that would otherwise disrupt the readability of the test plan.

In addition, the dispatch operation control described above which uses the dispatch function operation block 124 may be combined with both the asynchronous parallel execution described above, which uses the asynchronous parallel execution block 120, and the synchronous parallel execution described above, which uses the synchronous parallel execution block 122.

The asynchronous parallel execution block 120, the synchronous parallel execution block 122, and the dispatch function operation block 124, and functions implemented using the asynchronous parallel execution block 120, the synchronous parallel execution block 122, and the dispatch function operation block 124 are described below in the following order:
1) synchronous parallel execution,
2) asynchronous parallel execution, and
3) dispatch operation control.

In examples of test plans used in the description that follows, only columns necessary for a description of the function in question are displayed out of the columns illustrated in FIG. 3. It is to be understood that the columns that are not displayed are blank or contain given values depending on the context of the description being given.

Synchronous Parallel Execution

FIG. 4 illustrates a test plan input window 3100 that includes information for use in performing synchronous parallel execution. Referring to FIG. 4, the test plan window 3100 is tabular in form and includes a module name column and a device name column in block 102, a function column in block 106, and an input column, a terminal column, and an output column in block 108. The test plan window 3100 also includes a block 3104 corresponding to the synchronous parallel execution block 122 of FIG. 3. The block 3104 includes a sequence column for specifying synchronous parallel execution. The sequence column may be used for entry of a sequence label. Rows having the same sequence label in a test plan are processed concurrently in synchronous parallel execution. The sequence label may be a letter string, instead of the numbers shown as examples in FIG. 4. The test plan rows to be executed concurrently in parallel may be entered as an upper row and a lower row set off at a distance from each other instead of as vertically successive rows.

Test plan rows to be executed concurrently in synchronous parallel execution have the same module name, the same measurement function name, and are grouped together for synchronous parallel execution processing. In one example implementation, the term "error" may be displayed when the execution of rows having the same sequence label, but different module names and different measurement function names is attempted. In another example, such rows are treated as rows for which parallel execution is conducted separately even though the rows have the same sequence label. Rows that have the same measurement function and the same sequence label and that differ from one another only in module name may be treated as different groups in parallel execution.

In the test plan illustrated in FIG. 4, a measurement function IOFF2 3110 is entered in the first to third rows with the same sequence label "1" 3114. The measurement function IOFF2 3110 is specified for execution by synchronous parallel execution for the devices TR1 to TR3 with the use of input and output parameters defined in the respective rows in a block 3112.

Figure 11:
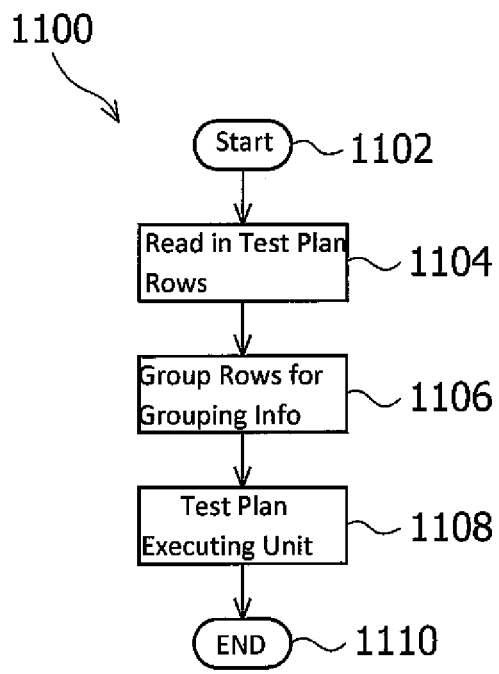
FIG. 11 is a flow chart illustrating the operation of a test plan interpreting unit in FIG. 2.

The operation of the test plan illustrated in FIG. 4 is described with reference to the flow chart 1100 in FIG. 11, which describes the operation of the test plan interpreting unit 408 of FIG. 2. As illustrated in FIG. 11, when processing is started in Step 1102, the test plan interpreting unit 408 reads all rows of the test plan 3100 from the top downward as indicated in Step 1104.

The test plan interpreting unit 408 next groups the rows by module name. Rows are then grouped by measurement function name, and then by sequence label. The test plan interpreting unit 408 stores in memory various types of information relating to the groups, such as test plan row numbers, device names, and input and output parameters as indicated in Step 1106.

It should be noted that, when test plan rows are grouped by sequence label, rows that have no sequence label are grouped together as one group. Test plan rows that have no sequence label, and test plan rows having a module name, a measurement function name, or a sequence label that are found as a result of grouping to be shared by no other rows, are recognized as rows that are targets of sequential execution. Test plan rows having a module name, a measurement function name, or a sequence label that are found as a result of grouping to be shared by two or more rows are recognized as rows that are targets of synchronous parallel execution.

The test plan interpreting unit 408 finishes the processing, and passes the result of the processing to a test plan executing unit 410 as indicated in Step 1108. Processing of the test plan interpreting unit 408 (in FIG. 2) is ended as indicated in Step 1110. It is noted that the processing of FIG. 11 which is related to synchronous parallel execution does not involve generating threads to be executed in parallel asynchronously. The test plan executing unit 410 in Step 1108 is therefore essentially the test plan execution unit 410-1 of FIG. 2.

Figure 12:
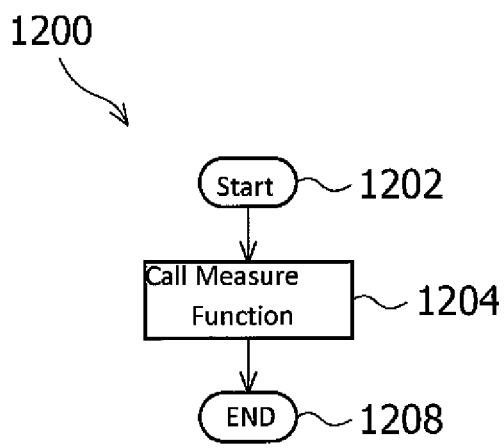
FIG. 12 is a flow chart illustrating the operation of a test plan executing unit in FIG. 2.

FIG. 12 is a flow chart 1200 illustrating the operation of the test plan executing unit 410 in FIG. 2. When processing is started in Step 1202, the test plan executing unit 410 calls measurement functions in the test plan in a given order based on the received processing result, passes various types of information such as input and output parameters as arguments to the measurement function called as indicated in Step 1204, and ends the processing at Step 1208.

In an example implementation, the order of calling measurement functions for the test plan illustrated in FIG. 4 may be as follows. First, the rows in the test plan are executed in the order that the rows are written, from top downward. If the target row during this execution is a sequential execution row, only that one test plan row is executed. If the target row during this execution is a synchronous parallel execution row, and is at the top among rows that have the same sequence label as the target row, each of the synchronous parallel execution rows having the same sequence label are executed in parallel synchronously. That is, when executing test plan rows from top downward in the order that the rows are presented, rows that have already been executed by synchronous parallel execution because of their sequence labels are skipped over and not executed. This measurement function calling order enables the user to control the execution order so that rows in a test plan are executed in the order the rows appear on the test plan.

In another example implementation, the execution order of a test plan may be based on what is entered in the sequence label for the rows, and rows having no sequence label, or rows whose sequence labels contain a null, are executed from top downward by sequential execution. Next, rows having sequence labels that do not have reserved words, or rows that have non-reserved word sequence labels, are executed by synchronous parallel execution on a group-by-group basis in ascending order, for example. Next, rows having reserved word sequence labels are executed by synchronous parallel execution in a predetermined order. This measurement function calling order enables the user to uniquely control the execution order based on what is entered in the sequence label for the rows.

In still another example implementation, the test system is configured to determine the execution order using the entries in the sequence label as a reference. This measurement function calling order allows the test system to control the execution order to suit the convenience of the test system. Therefore, an execution order suited to required performance, such as test time optimization or noise characteristics optimization, is obtained by executing test plan rows in an order optimized by the test system.

The following describes how various types of information such as input and output parameters are passed as arguments to a measurement function in sequential execution and in synchronous parallel execution when the test plan executing unit 410 calls measurement functions, in a given order and passes various types of information such as input and output parameters to the measurement function called. FIG. 5 is an example of source code for an example of a measurement function that may be used in the test plan in FIG. 3. The function in FIG. 5 uses a variable-length array parameter as an argument of a measurement function. The variable-length array parameter is defined as having the vector type in the C++ language. In other example implementations, a measurement function may be written in other programming languages that support variable-length array parameters.

In an example in which a test plan row in the test plan in FIG. 4 that contains values "Module B," "TR4," and "IOFF2" is executed with the source code of the example of FIG. 5, the measurement function IOFF2 of FIG. 5 is called once. In addition, the arguments expressed in a source code format in Table 1 below may be passed to the measurement function. In the case of an input parameter, a parameter having an array count of 1, which points to the parameter contents indicating the row for vd in Table 1, is passed to the measurement function. In the case in which the measurement function receives an output parameter, a single parameter having an array count of 1, which points to the line for Id in Table 1, is received by pass-by-reference.

TABLE 1

| Calling Measurement Function IOFF2 Only for TR1 |
|---|
| Input Parameters:<br>    vector<double> vd = {0.90};<br>    vector<double> vg = {1.0};<br>    vector<double> compliance = {0.1};<br>    vector<int> g = {1};<br>    vector<int> d = {2};<br>    vector<int> s = {3};<br>    vector<int> sub = {4};<br>Output Parameter:<br>    vector<double>& Id={&Id1}; |

If execution involves parallel execution, such as for example, parallel execution for the devices TR1, TR2, and TR3 as illustrated in block 3112 of FIG. 4, the measurement function IOFF2 is called only once. In addition, individual parameters are vectorized, or organized in a matrix as shown in Table 2, to compress three instances of passing input and output parameters and arguments into one instance. In the row for parameter vd in Table 2, vd is defined as being a vector-type, double-type (double-precision floating point) parameter of the C++ language whose value is an array having three values, {0.90, 0.45, 0.05}.

TABLE 2

In the Case of Calling Measurement Function IOFF2 for TR1 to TR3

Input Parameters:
    vector<double> vd = {0.90, 0.45, 0.05};
    vector<double> vg = {1.0, 1.2, 0.9};
    vector<double> compliance = {0.1, 0.1, 0.1};
    vector<int> g = {1, 5, 9};
    vector<int> d = {2, 6, 10};
    vector<int> s = {3, 7, 11};
    vector<int> sub = {4, 8, 12};
Output Parameter:
    vector<double>& Id={Id1, &Id2, &Id3};

As described above, the test plan executing unit 410 assembles the arguments of the measurement functions that have been grouped by module name, measurement function name, and sequence label for parallel execution into a variable-length array. The test plan executing unit 410 then generates the arguments as vectorized arguments, and passes the vectorized arguments as arguments of the measurement function being executed to one of the measurement function and dispatch function control units 412. It is noted that the test plan executing unit 410 in FIG. 4 calls a measurement function only once for all of a plurality of devices.

The function control unit 412 uses the measurement function executing unit 414 to execute the measurement function based on the received vectorized arguments. In the case in which measurement function calls a measurement library function, which may be an API that is provided by the tester, the function control unit 412 passes relevant arguments, which may include some of the previously received vectorized arguments. The function control unit 412 then calls the library function, and transfers control to its own library (API) calling unit 416.

The library (API) calling unit 416 receives the library function call and the vectorized arguments. The library (API) calling unit 416 organizes the arguments into those that are suitable for the library function to be called. The library in question is called, and control is transferred to one of the library (API) control units 418.

Figure 13:
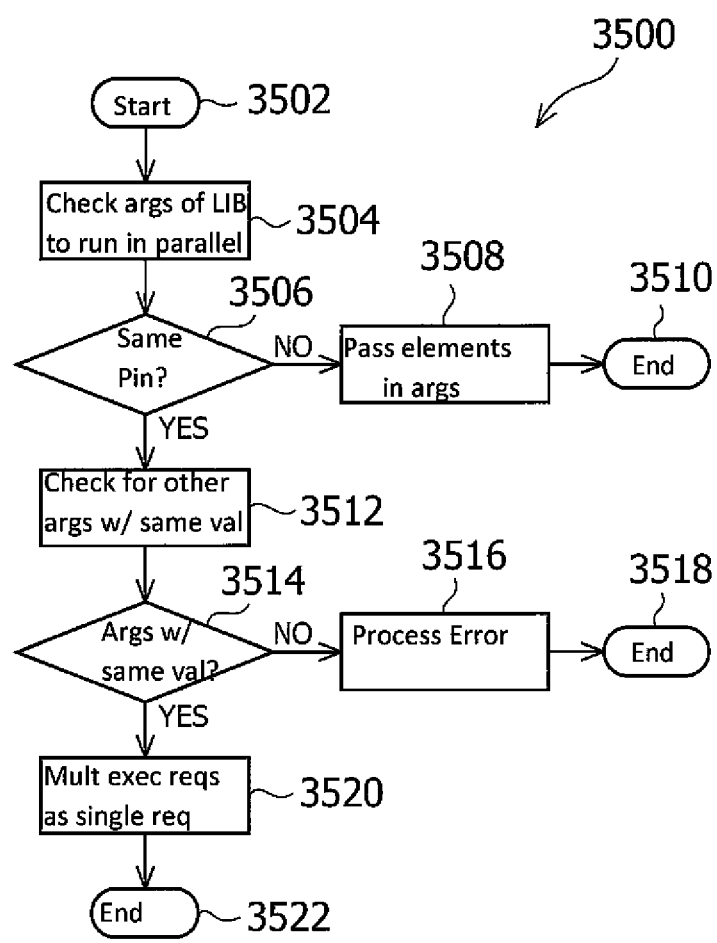
FIG. 13 is a flow chart illustrating the operation of a library (API) executing unit of FIG. 2.

The library (API) control unit 418 transfers control to the library (API) executing unit 419, and based on the passed arguments, the library (API) executing unit 419 operates according to the flowchart 3500 in FIG. 13. Referring to FIG. 13, when the processing is started in Step 3502, the library (API) executing unit 419 checks the arguments of the libraries to be executed in parallel out of the library arguments passed to the library (API) executing unit 419 as indicated in Step 3504. The library (API) executing unit 419 next checks whether or not there are arguments that specify the same pin number as indicated at Step 3506. If the check finds no arguments with the same pin number, the library (API) executing unit 419 proceeds to Step 3508 where elements given by the arguments to a tester control unit are passed. Processing of flowchart 3500 then ends at Step 3510.

If the check at step 3506 finds arguments that specify the same pin number, the library (API) executing unit 419 proceeds to Step 3512 to check whether or not other elements of the found arguments besides the pin number (such as applied voltage and voltage and current limit values) share the same value. In Step 3514, the library (API) executing unit 419 determines whether or not the other elements of the found arguments than the pin number are the same. When the other elements are not the same, the library (API) executing unit 419 proceeds to Step 3516 to process the arguments as an error, and ends the processing 3500 (Step 3518). When it is determined in Step 3514 that the other elements of the found arguments other than the pin number are the same as well, the library (API) executing unit 419 proceeds to Step 3520 to pass a plurality of execution control requests for the same pin as a single control execution request to the tester control unit. The processing of flowchart 3500 is then ended at Step 3522.

Figure 14:
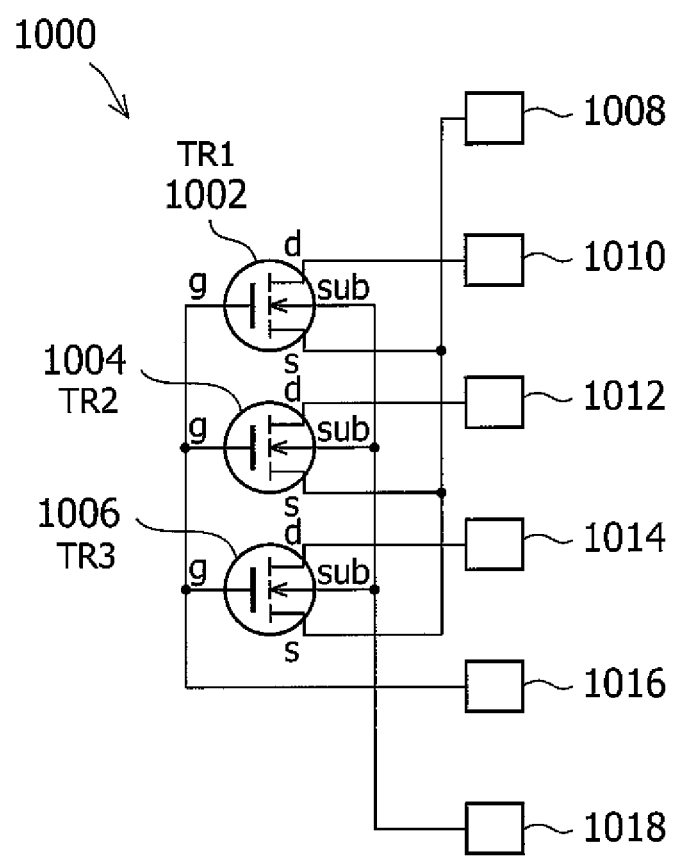
FIG. 14 is a block diagram illustrating an example of a TEG that has shared pads.

FIG. 14 illustrates an example implementation in which a test of Module A's TEG 1000, which has shared pads, is parallelized. The TEG 1000 of Module A includes three FETs, TR1 1002, TR2 1004, and TR3 1006, and has shared pads with source terminals 's' of the three FETs connected to a first pad 1008, and substrate terminals 'sub' of the three FETs connected to a sixth pad 1018. Using a test plan that uses the measurement function IOFF in FIG. 8 to measure the TR1 1002 to TR3 1008, the voltage applying function (force_v) is called for the first FET to apply voltages to the shared source pad and the shared substrate pad, and then the voltage applying function (force_v) is called twice more in processing of the second FET and of the third FET to apply voltages to these shared pads, which is redundant.

In an example implementation, when a measurement function that is not optimized in terms of processing of shared pads is used in the process shown in FIG. 13 on a TEG having shared pads as shown in FIG. 14, the library (API) executing unit 419 may detect an argument that calls for repeating the step of setting the same application voltage or some other parameter to the same pad. The library (API) executing unit 419 detects, for example, that the same pin has been passed, and executes a library (API) function omitting redundant processing so that the same process is executed only once. Accordingly, redundant processing for a shared pad may be optimized using synchronous parallel execution processing as long as settings are the same.

The library (API) executing unit 419 performs the process illustrated in the flowchart 3500 of FIG. 13 and transfers control to its associated hardware control firmware calling unit 420. The hardware control firmware calling unit 420 responds to a received control request, converts the control request relating to sequential execution and parallel execution into a call for the hardware control firmware 432 in the tester 430, and outputs the call to the tester 430.

Based on the command from the relevant library (API) control unit 418, the tester 430 executes the measurement resource hardware 434 by sequential execution or parallel execution via the hardware control firmware 432, to thereby conduct a desired test on one or more DUTs 440.

The types of argument in libraries (APIs) that may be used by the tester 430 in FIG. 3 are described next. Table 3 is c++ code that defines a parameter type "VecDblOrDbl" that may be used for the second argument of the library function force_v used for applying voltages in FIG. 5.

TABLE 3

Parameter Type

```
Class VecDblOrDbl {
public:
    VecDblOrDbl(const vector<double>& x);
    VecDblorDbl(const double x);
}
```

The test system is able to receive arguments as vector-type double as well as a scalar-type double. In addition, a program may be written as a conventional scalar type, which is the case for the second argument "0.0" of the third and fourth force_v functions of FIG. 5. The test system spares the user the task of modifying a part of a description in a conventional measurement function in which an argument is passed by value, and allows the user to reuse the measurement function.

By providing a test plan written in a tabular form with a sequence label column to specify test plan rows to be executed in parallel synchronously, selected parts of a test plan can easily be specified or unspecified for execution by synchronous parallel execution. No recompilation in a test plan programming environment is needed for test plans having a tabular form and are therefore easy to program. Implementation of synchronous parallel execution and the debugging of test plans that use synchronous parallel execution is facilitated.

Table 4 illustrates a comparison between the example of a conventional measurement function described above and an example of a measurement function according to a test system capable of scalable synchronous parallel execution. In Table 4, the first to fourth rows show parameters of arguments, the fifth to eighth rows show test specifications, and the ninth to twenty-seventh rows show source codes of the measurement functions. The sixth, seventh, and eighth rows are executed in sequential order, whereas the sixth to eighth rows are executed concurrently using scalable synchronous parallel execution. In the twenty-fourth to twenty-sixth rows of the scalable function, a resistance R is calculated for each device with the use of measurement results of the respective devices shown in the sixth to eighth rows. A function R.size( ) in the twenty-fourth row is a function for returning the array count with respect to the parameter R.

TABLE 4

Comparison between Conventional Measurement Function and Scalable Measurement Function

| | | | Conventional Function | | | | Scalable Function | | |
|---|---|---|---|---|---|---|---|---|---|
| 1 | Input | V = REAL | REAL V | | | | vector <REAL> V | | |
| 2 | Terminal | H | INTEGER pins[ ] | | | | vector <INTEGER> H | | |
| 3 | | L | INTEGER pins[ ] | | | | vector <INTEGER> L | | |
| 4 | Output | R = REAL | REAL *R | | | | vector <REAL> &R | | |
| 5 | Test Spec | | Seq # | Input | Terminal | Output | Seq # | Input | Terminal | Output |
| 6 | | | 1 | V = 1.5 | H = 1, L = 2 | | 1 | V = 1.5 | H = 1, L = 2 |
| 7 | | | 2 | V = 1.0 | H = 3, L = 4 | | 1 | V = 1.0 | H = 3, L = 4 |
| 8 | | | 3 | V = −1.0 | H = 5, L = 6 | | 1 | V = −1.0 | H = 5, L = 6 |
| 9 | Function Body | | RMS( | REAL V, | | | RMES( | vector <REAL> V, | |
| 10 | | | | INTEGER pins[ ], | | | | vector <INTEGER> H, | |
| 11 | | | | | | | | vector <INTEGER> L, | |
| 12 | | | | REAL *R | ){ | | | vector <REAL> &R | ){ |
| 13 | | | | int H, L; | | | | | |
| 14 | | | | H=pins[0]; | | | | | |
| 15 | | | | L=pins[1]; | | | | | |
| 16 | | | | | | | | | |
| 17 | | | | connect_pins(SMU1, H); | | | | connect_pins(PSMU, H); | |
| 18 | | | | connect_pins(SMU3, L); | | | | connect_pins(PSMU, L); | |
| 19 | | | | | | | | | |
| 20 | | | | force_v(H, V, 0.0, 1e−3); | | | | force_v(H, V, 0.0, 1e−3); | |
| 21 | | | | force_v(L, 0.0, 0.0, 1e−3); | | | | force_v(L, 0.0, 0.0, 1e−3); | |
| 22 | | | | double l; | | | | double l; | |
| 23 | | | | measure_i(H, 0.0, &l); | | | | measure_i(H, 0.0, &l); | |
| 24 | | | | | | | | for (int i=0;l < R.size( ); int++) { | |
| 25 | | | | *R = V / l; | | | | R[i] = V[i] / l[i]; | |
| 26 | | | | | | | | } | |
| 27 | | | | } | | | | } | |

The unit of parallel execution performed by specifying a sequence label is one row of a test plan at a time. This hardly changes test plan readability and makes it easier to understand, which equals less chance for errors. The row-by-row basis also facilitates the automatic generation of a test plan that includes parallelization, and helps to increase productivity.

Asynchronous Parallel Execution

Figure 15:
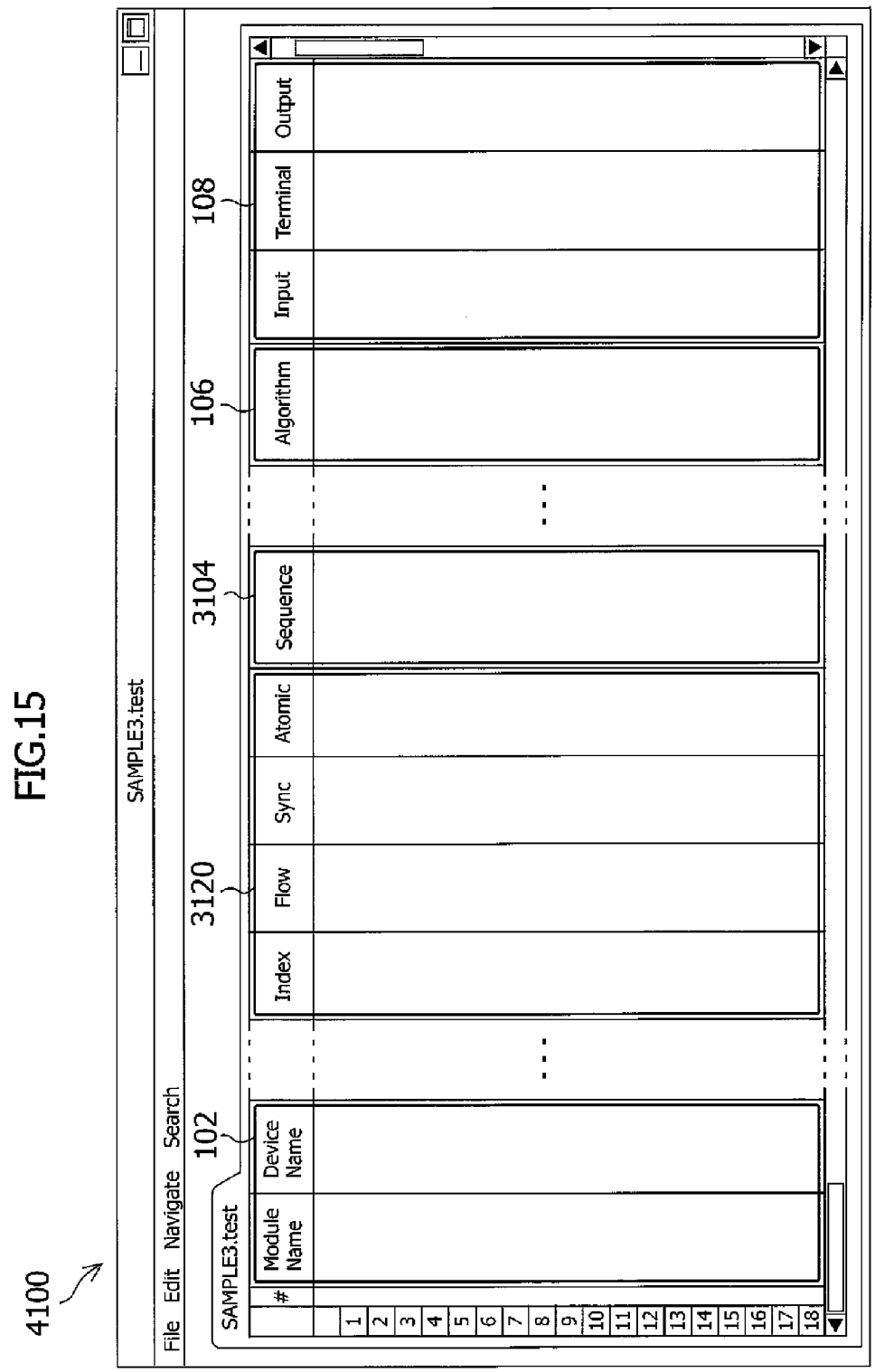
FIG. 15 shows an example of the test plan of FIG. 3 that implements asynchronous parallel execution.

Asynchronous parallel execution allows for parallel execution without requiring that the module name and measurement function be the same. FIG. 15 is a test plan input window 4100 in a tabular form that incorporates asynchronous parallel execution. The test plan window 4100 includes a module name column and a device name column in block 102 similar to block 102 in FIG. 3. Block 106 includes a measurement function column, and block 108 includes an input column, a terminal column, and an output column similar to blocks 106 and 108 in FIG. 3. Block 3104 is the sequence column for specifying synchronous parallel execution described with reference to FIG. 4. The use of the sequence column block for asynchronous parallel execution is described below.

The test plan window 4100 in FIG. 15 includes an asynchronous parallel execution block 3120, which corresponds to the asynchronous parallel execution block 120 of FIG. 3. The asynchronous parallel execution block 3120 is used to specify execution by asynchronous parallel execution and information relating to asynchronous parallel execution. Asynchronous parallel execution block 3120 includes an index column, a flow column, a sync column, and an atomic column.

The operation of the flow column is described with reference to Table 5 below. It is noted that the tables below may only have values in columns that are relevant to the description, or may only show have columns that are relevant to the description.

TABLE 5

|   | Flow | Function |
|---|------|----------|
| 1 | 1    | IOFF     |
| 2 | 1    | ION      |
| 3 | 1    | VTH      |
| 4 | 2    | CMES     |
| 5 |      | RMES     |
| 6 |      | RMES     |

The flow column in the test plan shown in Table 5 contains a flow label that may be used to specify the grouping of rows that are to be executed in parallel asynchronously. The test plan interpreting unit 408 of FIG. 2 interprets all rows of the test plan and groups together rows that have the same flow label. Rows that have no flow label may all be grouped into one group.

Figure 16:
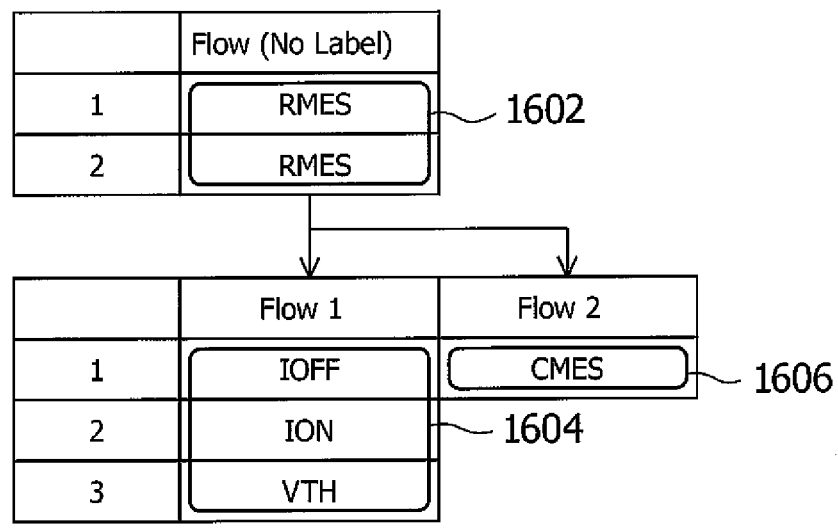
FIG. 16 is a diagram illustrating operation of an example of the test plan shown in Table 3.

FIG. 16 illustrates an ordering of rows that may be followed during execution of the test plan of Table 5. First, function REMS in the fifth and sixth rows of the test plan and grouped together as rows without a label are executed by sequential execution in the order indicated as shown in block 1602 in FIG. 16. Rows having flow labels are then executed in parallel on a flow label-by-flow label basis in the order indicated by the row number in the test plan. The rows are executed in parallel as a thread for executing a block 1604 having a flow label "Flow 1," and a thread for executing a block 1606 having a flow label "Flow 2." The generation of the threads illustrated by block 1604 and 1606 is illustrated in FIG. 2 as arrows extending from the test plan interpreting unit 408 to the test plan executing units 410-1 and 410-2. In an example implementation, the test plan interpreting unit 408 generates instances of the test plan executing unit 410-1 and 410-2.

The module name column, the device name column, the flow column, and the terminal column can hold values for specifying measurements that are executed in parallel asynchronously and concurrently. Execution may be on a module-by-module basis as described above, on a device-by-device basis as described above, in different measurement test units as in concurrent testing (for example, testing in which a digital test and an analog test constitute separate flows), on a package device-by-package device basis as in multi-site testing, or on any other suitable basis.

Execution of the test plan illustrated in Table 5 may result in interference between different flows. For example, it is assumed for purposes of illustration that the measurement object for Flow 1 and the measurement object for Flow 2 are FETs of different types. Because Flow 1 and Flow 2 are executed completely asynchronously, the second IOFF testing in Flow 2 may coincide with the first or second VTH testing of Flow 1 depending on the execution times of the respective rows. This results in interference from the VTH testing in the form of noise or other effects. Such interference may impair the accuracy of the small current measurement performed in the IOFF measurement function. The sync column in block 3120 in FIG. 15 may be used in cases that involve potential interference. The use of the sync column is described with reference to the test plan shown in Table 6.

TABLE 6

|   | Flow | Sync | Function |
|---|------|------|----------|
| 1 | 1    |      | IOFF     |
| 2 | 1    |      | VTH      |
| 3 | 1    | A    | IOFF     |
| 4 | 1    |      | VTH      |
| 5 | 2    |      | IOFF     |
| 6 | 2    |      | VTH      |
| 7 | 2    | A    | IOFF     |
| 8 | 2    |      | VTH      |

The sync column in the test plan in Table 6 includes a sync label in selected columns. During asynchronous parallel execution, functions having the same sync label are executed in parallel synchronously even when the functions are executed in different flows. For example, while functions in the test plan in Table 6 are divided into Flow 1 and Flow 2 for execution in parallel as shown in Table 7, the third row is an exception. For the third row, the measurement function IOFF of Flow 1, which has a sync label "A," and the measurement function IOFF of Flow 2, which also has the sync label "A" are executed in sync with each other. The plurality of functions executed in parallel synchronously using the sync column need not be the same functions. The functions that have the same sync label and are executed in parallel synchronously are in sync with each other only in terms of when the functions are started in their respective threads. These functions do not use the mechanism of synchronous parallel execution described above.

TABLE 7

|   | Flow 1 | | Flow 2 | |
|---|--------|----------|--------|----------|
|   | Sync   | Algorith | Sync   | Function |
| 1 |        | IOFF     |        | IOFF     |
| 2 |        | VTH      |        | VTH      |
| 3 | A      | IOFF     | A      | IOFF     |
| 4 |        | VTH      |        | VTH      |

In the test plan in Table 7, if the function IOFF of Flow 1 executes for a length of time that differs from the length of time it takes for the function IOFF of Flow 2 to execute, for example, the function IOFF of one of the flows may still be in the process of executing when the function VTH of the other flow is started. This may adversely affect the IOFF measurement. The test plan in Table 8 illustrates a mechanism for avoiding this scenario.

TABLE 8

|   | Flow | Sync | Function |
|---|------|------|----------|
| 1 | 1    | 1    | IOFF     |
| 2 | 1    | 3    | VTH      |
| 3 | 1    | 4    | IOFF     |
| 4 | 1    | 6    | VTH      |
| 5 | 2    | 2    | IOFF     |
| 6 | 2    | 3    | VTH      |
| 7 | 2    | 5    | IOFF     |
| 8 | 2    | 6    | VTH      |

In the test plan in Table 8, rows having the same sync label are started in sync with one another and executed as shown in Table 9.

TABLE 9

| | Flow 1 | | Flow 2 | |
|---|---|---|---|---|
| | Sync | Function | Sync | Function |
| 1 | 1 | IOFF | | |
| 2 | | | 2 | IOFF |
| 3 | 3 | VTH | 3 | VTH |
| 4 | 4 | IOFF | | |
| 5 | | | 5 | IOFF |
| 6 | 6 | VTH | 6 | VTH |

The test plan in Table 10 is similar to the test plan in Table 8 but modified to include an atomic column, which may be used to obtain similar results in IOFF tests.

TABLE 10

| | Flow | Atomic | Function |
|---|---|---|---|
| 1 | 1 | v | IOFF |
| 2 | 1 | | VTH |
| 3 | 1 | v | IOFF |
| 4 | 1 | | VTH |
| 5 | 2 | v | IOFF |
| 6 | 2 | | VTH |
| 7 | 2 | v | IOFF |
| 8 | 2 | | VTH |

The atomic column in the test plan in Table 10 may contain an atomic flag to indicate exclusive execution. The atomic flag is shown in Table 10 as an entry 'v.' In executing the test plan, the execution of functions that do not have an atomic flag is suspended while functions in rows that contain the atomic flag "v" are executed. Functions in rows that contain the atomic flag are executed exclusively. The user may enter an atomic flag in an atomic column for functions when the execution of the test plan may result in an interference due to the execution of another flow.

TABLE 11

| | Flow 1 | | Flow 2 | |
|---|---|---|---|---|
| | Atomic | Function | Atomic | Function |
| 1 | v | IOFF | | |
| 2 | | | v | IOFF |
| 3 | | VTH | | VTH |
| 4 | v | IOFF | | |
| 5 | | | v | IOFF |
| 6 | | VTH | | VTH |

An atomic label may be defined for the atomic column so that interference between flows is avoided by grouping together rows that have the same atomic label and executing functions on an atomic label group-by-atomic label group basis.

Table 12 is a test plan in which the advantages of synchronous parallel execution described above are introduced in addition to those of asynchronous parallel execution. The test plan in Table 12 combines the sequence column described above with the flow column. With respect to the flow label values and sequence label values entered in Table 12, a label value that starts with "#" creates a "no label" state by commenting out the label. During execution, when the "#" is encountered, the execution for the label that follows is not executed. The label prefix for commenting out labels facilitates debugging by easily singling out rows suspected of causing problems due to asynchronous parallel execution operation or synchronous parallel execution operation. The label prefix prevents execution of the row or function commented out and the debugger determines how execution is affected.

TABLE 12

| | Flow | Sequence | Function |
|---|---|---|---|
| 1 | 1 | 1 | A |
| 2 | 1 | 1 | A |
| 3 | 1 | 1 | A |
| 4 | 1 | 2 | B |
| 5 | 1 | 3 | C |
| 6 | 1 | 3 | C |
| 7 | 2 | #1 | D |
| 8 | 2 | #1 | D |
| 9 | #3 | 1 | E |
| 10 | #3 | 2 | F |
| 11 | #3 | 2 | F |
| 12 | #3 | 2 | F |

Figure 17:
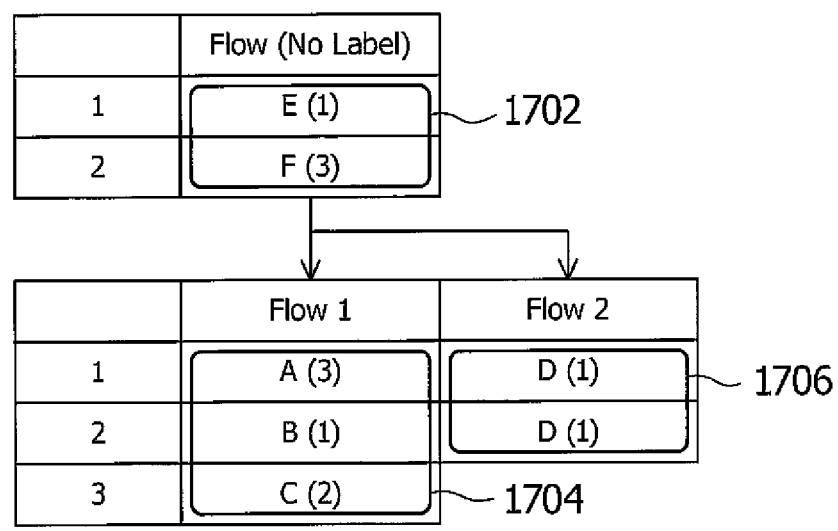
FIG. 17 is a diagram illustrating operation of an example of the test plan shown in Table 11.

The test plan of Table 12 is executed as illustrated in FIG. 17. In FIG. 17, each function name has a parenthesized number to its right indicating how many tests are executed in parallel synchronously. Rows in a block 1702, which hold functions E and F and have no flow label, are executed first. Functions in block 1704 of Flow 1, and functions in block 1706 of Flow 2 are executed by asynchronous parallel execution. Functions in block 1706 are executed by sequential execution. The functions in block 1706 have a "1" as a parallel execution test count because the values associated with the functions in the sequence column are commented out.

The sequence label and the flow label to be employed may be determined as follows. For the parallel measurement of a plurality of devices of the same type, measurement by synchronous parallel execution with only the sequence label specified is chosen for execution. For parallel measurement of a plurality of modules, measurement by asynchronous parallel execution with only the flow label specified is chosen for execution. For parallel measurement of a plurality of devices of the same type in a plurality of modules, measurement by asynchronous parallel execution and synchronous parallel execution with both the flow label and the sequence label specified is chosen for execution. For measurement of all devices by sequential execution, or to obtain results of sequential execution measurement for a comparison against results of parallel measurement, sequential execution that specifies neither the flow label nor the sequence label is chosen.

A choice between synchronous parallel execution and asynchronous parallel execution when the sequence label or the flow label is commented out may be made as follows. For the most efficient measurement, measurement that enables both asynchronous parallel execution and synchronous parallel execution is conducted. In the case in which a problem such as interference due to synchronous parallel execution is suspected, measurement that enables asynchronous parallel execution alone is conducted. In the case in which a problem such as interference due to asynchronous parallel execution is suspected, measurement that enables synchronous parallel execution alone is conducted. When a problem such as both interference due to asynchronous parallel execution and synchronous parallel execution is suspected, or to obtain measurement data by sequential execution as comparison data, or when high quality measurement data is requested, measurement that disables both asynchronous parallel execution and synchronous parallel execution is conducted.

An index column may be added to the test plan to facilitate debugging by identifying problems during the debugging of asynchronous parallel execution. The use of an index column is described with reference to Table 13.

TABLE 13

| | Flow | Sync | Function |
|---|---|---|---|
| 1 | 1 | | IOFF |
| 2 | 1 | | ION |
| 3 | 1 | | VTH |
| 4 | 2 | | CMEAS |
| 5 | 1 | 1 | RMEAS |
| 6 | 1 | | RMEAS |
| 7 | 2 | 1 | FMEAS |
| 8 | 2 | | FMEAS |
| 9 | 3 | 1 | VMEAS |

Figure 18:
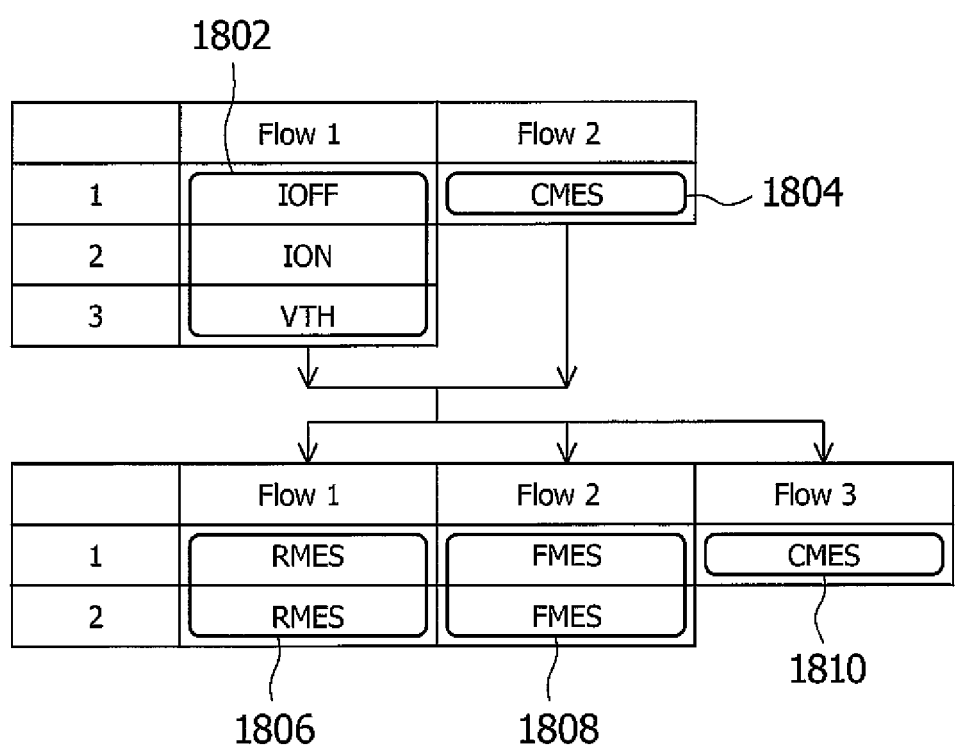
FIG. 18 is a diagram illustrating operation of an example of the test plan shown in Table 13.

Table 13 is a test plan that uses the flow column and the sync column. FIG. 18 is a diagram illustrating operation of an example of the test plan shown in Table 13. FIG. 18 shows Flow 1 of block 1802 and Flow 2 of block 1804 executed first in parallel asynchronously. Thereafter, Flow 1 of block 1806, Flow 2 of block 1808, and Flow 3 of block 1810 are executed in parallel asynchronously.

If the sync label is deleted from one of the fifth, seventh, and ninth rows of Table 13 in order to identify a problem, the structure of the blocks 1806 to 1810 of FIG. 18 is lost, which makes it difficult to debug the test plan of Table 13. In order to avoid an influence from the mutual relation of the flow column, the sync column, and the atomic column, an index column which is a host column to these three columns is provided to remove the sync column. The index column is added to the test plan as shown in Table 14.

TABLE 14

| | Index | Flow | Function |
|---|---|---|---|
| 1 | 1 | 1 | IOFF |
| 2 | 1 | 1 | ION |
| 3 | 1 | 1 | VTH |
| 4 | 1 | 2 | CMEAS |
| 5 | 2 | 1 | RMEAS |
| 6 | 2 | 1 | RMEAS |
| 7 | 2 | 2 | FMEAS |
| 8 | 2 | 2 | FMEAS |
| 9 | 2 | 3 | VMEAS |

The index column as configured in Table 14 forces the blocks 1802 and 1804 in FIG. 18 to execute first by asynchronous parallel execution, followed by the asynchronous parallel execution of blocks 1806 to 1810. The problem described above with the removal of the sync label in Table 13 does not occur. In general, the index column may be used to specify the order of function groups that are executed in parallel asynchronously in the respective flows. The index column may also be viewed as a way of indicating the relative priority of the rows in the table.

Figure 19:
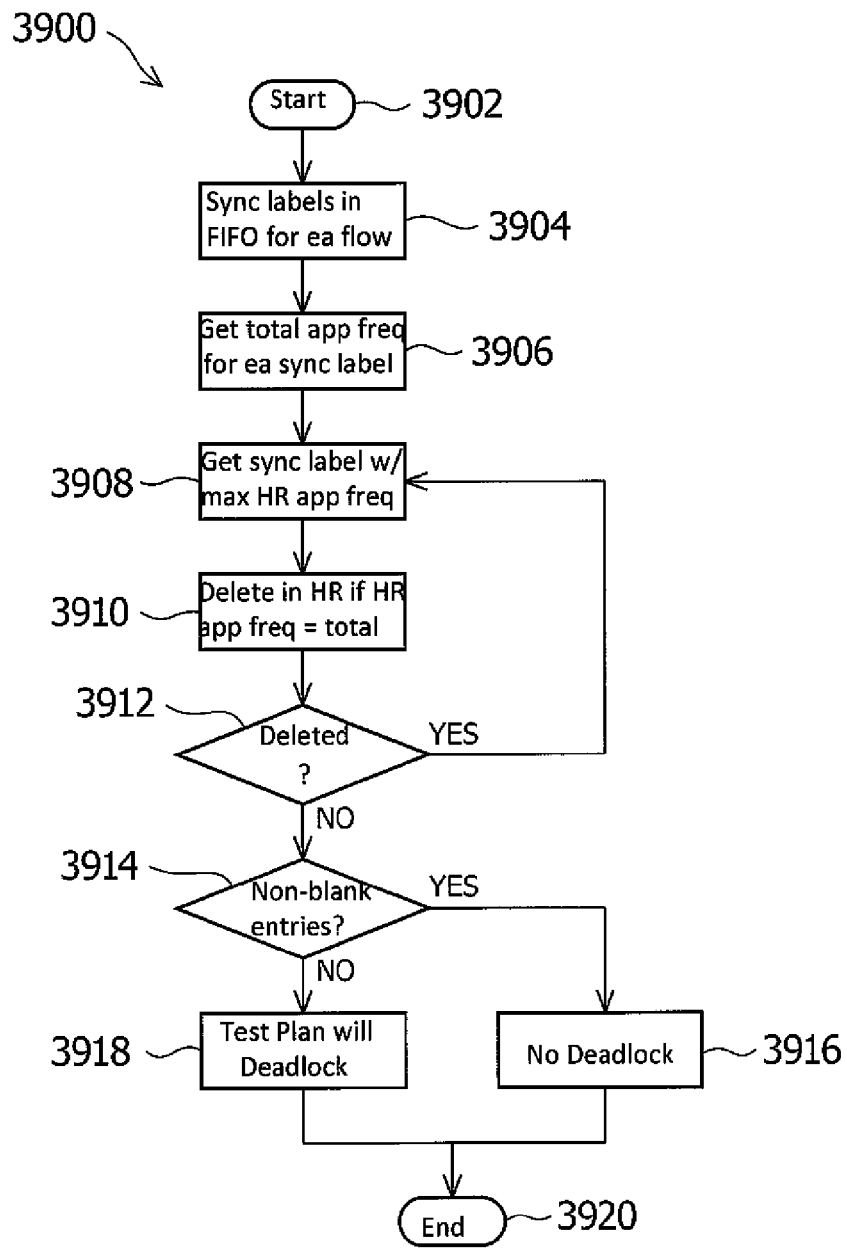
FIG. 19 is a flow chart illustrating operation of an example of a deadlock-detecting program that may be executed by the test plan interpreting unit in FIG. 2.

Columns in a test plan related to asynchronous parallel execution described above may be used to detect a deadlock in asynchronous parallel execution. A deadlock may occur when, for example, a test plan is programmed so that, while one thread of the first parallel processing waits to start until a thread of the second parallel processing is finished, another thread of the second parallel processing does not start unless another thread of the first parallel processing is finished. In an example implementation, the semiconductor parametric test system may be configured to issue an alert about a test plan that is predicted to incur a deadlock before the test plan is executed. The semiconductor parametric test system may read all rows of the test plan and execute a deadlock detecting method, an example of which is illustrated in FIG. 19 with the test plan interpreting unit 408 of FIG. 2.

The test plan interpreting unit 408 reads all rows of a test plan, interprets how sync labels are assigned to the respective flows, and determines by analysis that sync labels are assigned as shown in Table 15.

TABLE 15

| | Flow 1 Sync | Flow 2 Sync | Flow 3 Sync | Flow 4 Sync |
|---|---|---|---|---|
| 1 | 1 | 1 | 1 | 1 |
| 2 | 2 | 2 | | 2 |
| 3 | 3 | | | 3 |
| 4 | 4 | | | |
| 5 | 5 | 5 | 5 | 5 |
| 6 | | 6 | | 6 |
| 7 | | 7 | | |
| 8 | | | | 8 |
| 9 | 9 | 9 | 9 | 9 |
| 10 | 10 | 10 | 10 | 10 |

The test plan interpreting unit 408 then executes a deadlock detecting program 3900 according to the flowchart in FIG. 19. The test plan interpreting unit 408 starts the program at Step 3902, and puts sync labels of the respective flows into a FIFO buffer (hereinafter referred to as FIFO) in the order of appearance at Step 3904. As a result, a part of Table 15 where sync labels are null is omitted from the contents of the FIFO and sync values are accumulated in the FIFO as shown in Table 16. The FIFO is provided in the memory 346 of FIG. 1.

TABLE 16

| | Flow 1 Sync | Flow 2 Sync | Flow 3 Sync | Flow 4 Sync |
|---|---|---|---|---|
| 1 | 1 | 1 | 1 | 1 |
| 2 | 2 | 2 | 5 | 2 |
| 3 | 3 | 5 | 9 | 3 |
| 4 | 4 | 6 | 10 | 5 |
| 5 | 5 | 7 | | 6 |
| 6 | 9 | 9 | | 8 |
| 7 | 10 | 10 | | 9 |
| 8 | | | | 10 |

In Step 3906, the test plan interpreting unit 408 counts, for each sync label, the appearance frequency throughout the entire FIFO, and saves the appearance frequency. For example, a sync label "2" has an appearance frequency of 3. In Step 3908, the test plan interpreting unit 408 obtains the highest appearance frequency in the head entries of the respective flows in the FIFO. In the case of Table 16, a sync label "1" has the highest appearance frequency at 4. In Step 3910, the highest sync label appearance frequency obtained in Step 3908 is compared against the appearance frequency of the corresponding sync label which has been obtained in Step 3906. If the two match, entries of the sync label (in this example, four "1"s of "Flow 1 Sync" to "Flow 4 Sync" in the first row of Table 16) are deleted from the head row of the FIFO. If the entries above those of the respective flows in the FIFO include blank entries and entries below those of the flows include non-blank entries, the non-blank entries are shifted upward. Step 3912 determines whether or not an entry has been deleted from the head row of the FIFO in Step 3910. When Step 3912 determines that yes, an entry has been deleted, the test plan interpreting unit 408 returns to Step 3908. Step 3912 proceeds to Step 3914 when the answer is no. Step 3914 determines whether or not a non-blank entry remains in the FIFO. The test plan interpreting unit 408 proceeds to Step 3916 when the answer to Step 3914 is yes, and to Step 3918 when the answer is no. In Step 3916, the test plan interpreting unit 408 determines that a dead lock does not occur in the current test plan, and proceeds to Step 3920 to end this program. In Step 3918, the test plan interpreting unit 408 determines that a deadlock is going to occur in the current test plan, displays an alert or "error", and proceeds to Step 3920 to end this program.

In asynchronous parallel execution, the test plan execution units 410 are generated in the test plan control unit 406 of FIG. 2, which is capable of parallel execution in association with respective threads that are executed by asynchronous parallel execution. Blocks are executed accordingly to control the tester 430. The columns illustrated in FIG. 15 are provided as columns for asynchronous parallel execution. The asynchronous parallel execution can also be combined with the synchronous parallel execution described above. The asynchronous parallel execution may be used to specify parallel execution as well as overlapping parallel measurements, switching between parallel and serial, avoiding interference in measurement, performing explicit parallel execution order control, and detecting a deadlock prior to parallel execution.

Dispatch Operation Control

Figure 20:
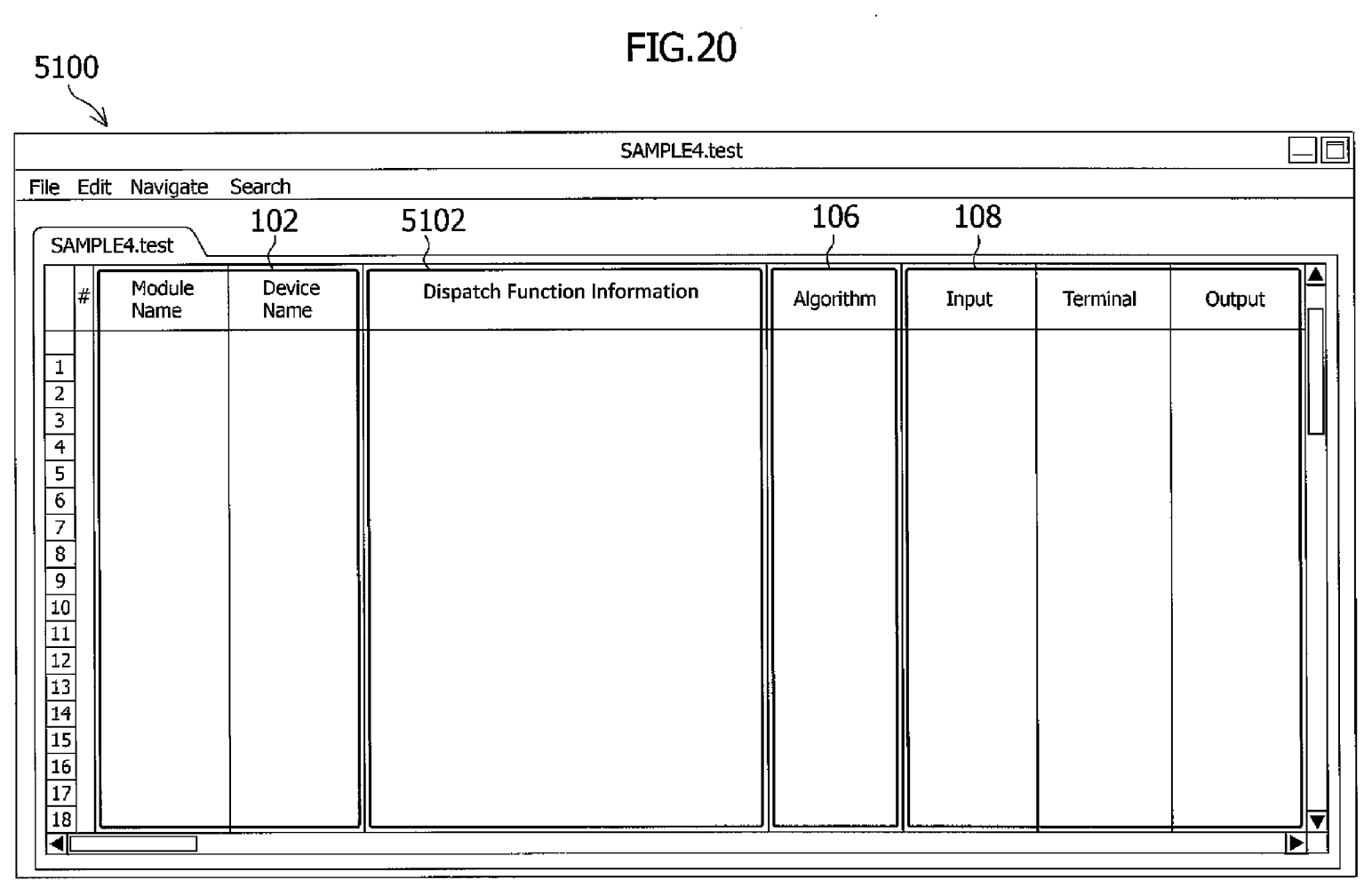

FIG. 20 shows a test plan input window 5100 for dispatch operation control using a tabular form test plan capable of performing parallel testing. The test plan input window 5100 in FIG. 20 includes a module name column and a device name column in block 102, a function column in block 106, and an input column, a terminal column, and an output column in block 108. The test plan input window 5100 includes block 5102, which corresponds to the dispatch function operation block 124 described above with reference to FIG. 3. Block 5102 includes a dispatch label column 5202, a dispatcher column 5204, and a block 5206 that includes a dispatcher input column, a dispatcher terminal column, and a dispatcher output column. The block 5102 further includes a dispatcher label 2 column 5302, a dispatcher 2 column 5304, and a block 5306 that includes a dispatcher input 2 column, a dispatcher terminal 2 column, and a dispatcher output 2 column. The dispatch label column 5202, the dispatcher column 5204, and the dispatcher input column, dispatcher terminal column, and dispatcher output column in block 5206 are used to specify information relating to a first dispatch function. The dispatcher label 2 column 5302, the dispatcher 2 column 5304, and the dispatcher input 2 column, the dispatcher terminal 2 column, and the dispatcher output 2 column in block 5306 are used to specify information relating to a second dispatch function. The columns for information relating to the second dispatch function are optional and may be omitted if not needed for performing dispatch control.

The information relating to the first dispatch function is specified for a test plan by entering the information in the relevant columns. A dispatch label may be entered in the dispatch label column 5202. The dispatch label may be entered as numbers, letters, or a combination thereof. If a row contains a null as a dispatch label value, the row is interpreted as a row that performs its own dispatch operation. Rows that do not have null as a dispatch label, and have a dispatch label in common are grouped together, and interpreted as code in which several case-analysis dispatch operations are entered in an integrated manner.

A dispatch function name may be entered in the dispatcher column 5204. The dispatcher input column in block 5206 is used for entering an input parameter. The dispatcher terminal column in block 5206 is used for entering terminal information. The dispatcher output column in block 5206 is used for entering information about an output parameter.

The information relating to the second dispatch function may be specified for a test plan by entering the information in the dispatch label 2 column 5302, the dispatcher 2 column 5304, and the columns in block 5306. These columns 5302-5304 and the columns in block 5306 are similar to the columns in the columns 5202-5204, and the columns in block 5206, and may be used for information entry as described for the first dispatch function.

Figure 21:
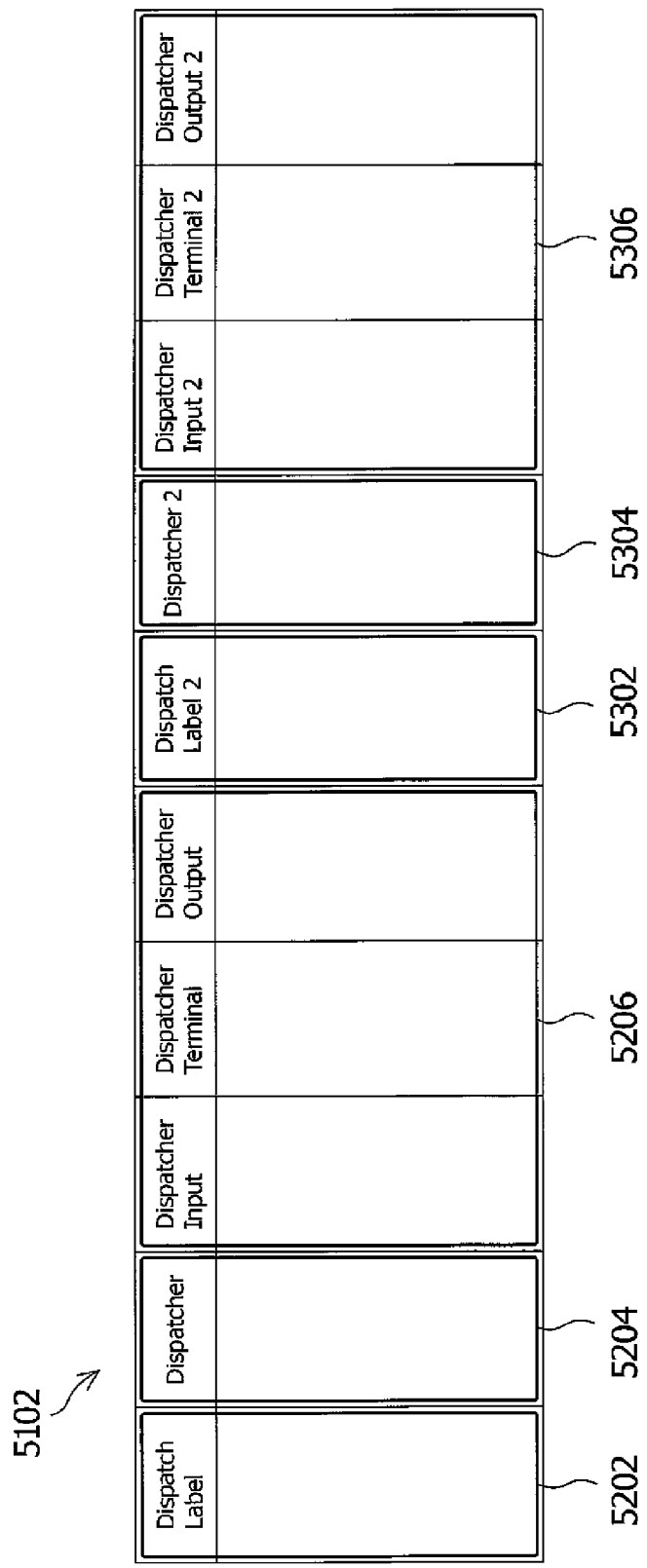
FIG. 21 is a diagram illustrating examples of the dispatch function information columns shown in FIG. 20.
Figure 22:
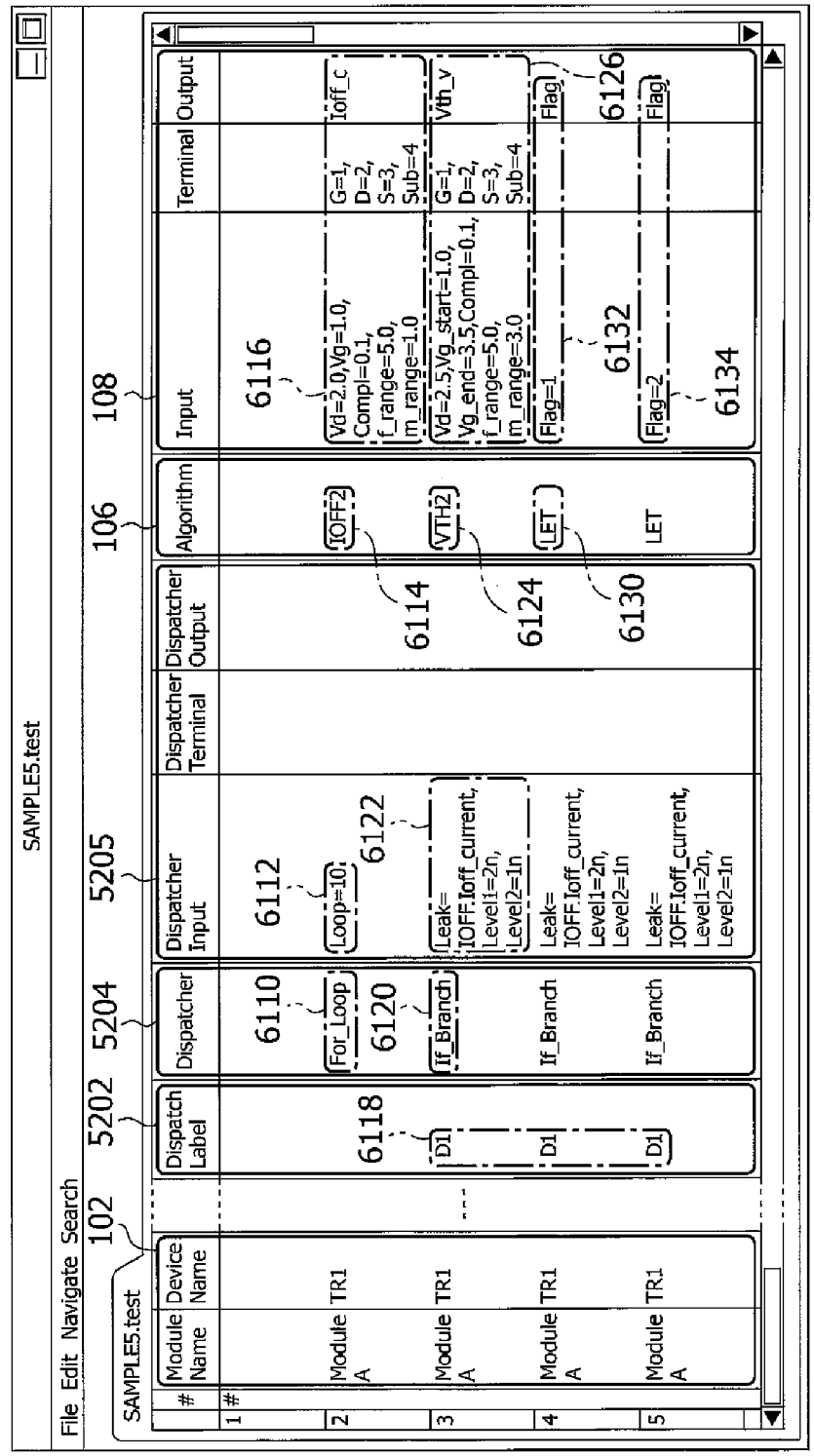
FIG. 22 is an example of a test plan that incorporates conditional processing and repetition processing described with reference to FIG. 20.

FIG. 22 is an example of a test plan that incorporates conditional processing and repetition processing described with reference to FIG. 20. The example illustrated in FIG. 22 uses the first dispatch function. FIG. 22 shows a test plan input window 6100 comprising blocks that are similar to those in FIGS. 20 and 21. These blocks are identified by the same reference numbers as those used in FIGS. 20 and 21.

Table 17 shows an example of source code for a dispatch function For_Loop 6110 shown in FIG. 22.

TABLE 17

```
void For_Loop(int Loop) {
    for(int i = 0; i < Loop; i++) {
        Execute(0);
    }
}
```

The For_Loop function 6110 repetitively executes a function Execute(0) the number of times indicated by an argument 'Loop,' which is included in the input parameters defined in 6112. The particular example shown at 6112 is ten times. The Execute function is provided by a dispatch function library (API) to execute the second dispatch function. The Execute function is called with a parenthesized integer value equal to or greater than 0 as an index. The Execute function may also execute a measurement function in a row that is reached by shifting downward from a test plan row that is being executed by the number of rows indicated by the index. In the illustrated example, the function Execute(0) executes an IOFF2 function 6114 of the same row based on the input and output parameters 6116 of the IOFF2 function 6114. The function to be executed is determined by the test plan execution units 410 of FIG. 2.

Table 18 contains an example of source code for a dispatch function If_Branch 6120 which is an example of conditional branching processing.

TABLE 18

```
void If_Branch(double Leak, double
Level1, double Level2) {
    if(Leak > Level1) {
        Execute(0);
    }
    else if(Leak > Level2) {
        Execute(1);
    }
    else {
        Execute(2);
    }
}
```

The functions, IF_Branch 6120, in the third to fifth rows of the test plan share the same dispatch label "D1." The If_Branch function 6120 processes these three rows as one group. When the value of "leak" passed as an input parameter 6122 is greater than twice the parameter n, a measurement function VTH 6124 entered in the third row is executed based on input and output parameters 6126 of the measurement function VTH2 6124. When the value of "leak" is greater than the parameter n and is equal to or less than twice the parameter n, a function LET 6130 of the fourth row is executed based on input and output parameters 6132. When the value of "leak" is equal to or less than the parameter n, a function LET of the fifth row is executed based on input and output parameters 6134.

The dispatch function control allows a user to configure a test plan with only one row for repetition processing and only three rows for branching processing involving three branches. In addition, the part of the test plan that corresponds to the conditional branching processing and repetition processing is executed using the compiled code of the dispatch function resulting in faster execution of the code.

In another example implementation, the dispatch function may also be used to reduce the length of test plans involving a large number of measurements as shown in Table 19.

TABLE 19

|   | Dispatcher | Dispatcher Input | Function | Input | Terminal | Output |
|---|---|---|---|---|---|---|
| 1 | For_Loop | Loop = 10 | IOFF2 | Vd = 1.0, Vg = 1.0, Compliance = 0.1, force_range = 5.0, measure_range = 1.0 | G = 1, D = 2, S = 3, Sub = 4 | Ioff_current1 |
| 2 | For_Loop | Loop = 10 | IOFF2 | Vd = 1.02, Vg = 1.0, Compliance = 0.1, force_range = 5.0, measure_range = 1.0 | G = 1, D = 2, S = 3, Sub = 4 | Ioff_current2 |
| 3 | For_Loop | Loop = 10 | IOFF2 | Vd = 1.04, Vg = 1.0, Compliance = 0.1, force_range = 5.0, measure_range = 1.0 | G = 1, D = 2, S = 3, Sub = 4 | Ioff_current3 |
| . | . | . | . | . | . | . |
| 100 | For_Loop | Loop = 10 | IOFF2 | Vd = 2.98, Vg = 1.0, Compliance = 0.1, force_range = 5.0, measure_range = 1.0 | G = 1, D = 2, S = 3, Sub = 4 | Ioff_current100 |

A test plan for an array TEG may also be written in as shown in Table 20 by using a dispatch function, Arry_ctl, which controls addressing of array devices as shown in Table 21. The dispatch function may be used to reduce the size of test plans involving similar processes that are constantly and frequently executing and classified as routine processing.

TABLE 20

|   | Device Name | Dispatcher Name | Dispatcher Input | Dispatcher Terminal | Function | Input | Terminal | Output |
|---|---|---|---|---|---|---|---|---|
| 1 | TR1 | Arry_Ctl | addr = 1, vdd = 2 | adT1 = 101, adT2 = 102, adT3 = 103, vddT = 104 | IOFF2 | Vd = 2.0, Vg = 1.0, Compl = 0.1, f_range = 5.0, m_range = 1.0 | G = 1, D = 2, S = 3, Sub = 4 | Ioff_c1 |
| 2 | TR2 | Arry_Ctl | addr = 2, vdd = 2 | adT1 = 101, adT2 = 102, adT3 = 103, vddT = 104 | IOFF2 | Vd = 2.0, Vg = 1.0, Compl = 0.1, f_range = 5.0, m_range = 1.0 | G = 1, D = 2, S = 3, Sub = 4 | Ioff_c2 |
| 3 | TR3 | Arry_Ctl | addr = 3, vdd = 2 | adT1 = 101, adT2 = 102, adT3 = 103, vddT = 104 | IOFF2 | Vd = 2.0, Vg = 1.0, Compl = 0.1, f_range = 5.0, m_range = 1.0 | G = 1, D = 2, S = 3, Sub = 4 | Ioff_c3 |
| . | . | . | . | . | . | . | . | . |
| 100 | TR100 | Arry_Ctl | addr = 100, vdd = 2 | adT1 = 101, adT2 = 102, adT3 = 103, vddT = 104 | IOFF2 | Vd = 2.0, Vg = 1.0, Compl = 0.1, f_range = 5.0, m_range = 1.0 | G = 1, D = 2, S = 3, Sub = 4 | Ioff_c100 |

TABLE 21

```
void    Arry_Ctl(int addr, double
vdd,    int adT1, int adT2,
        int adT3, int vddT) {
    initializeVdd(vdd, vddT);
    setAddress(addr, adT1, adT2,
    adT3);
    Execute(0);
    resetVdd(vddT);
}
```

An example implementation of a simple adaptive test may be performed using a test plan configured to use dispatch operation control. An adaptive test may be implemented with a test plan without impairing the test plan's readability by entering, for example, a function Sampling, which is listed in Table 23. The function Sampling is used for reducing the tests in the dispatcher column as shown in Table 22. The function Sampling is a function that calls a measurement function by moving a die to be tested to a particular site based on a label "key," which is entered in the dispatcher input column. This function allows for a selection of only critical dies for testing instead of testing all dies on a wafer.

TABLE 22

| | Device Name | Dispatcher | Dispatcher Input | Function | Input | Terminal | Output |
|---|---|---|---|---|---|---|---|
| 1 | TR1 | Sampling | key = "A" | ION2 | Vd = 2.0, Vg = 4.5, Compl = 0.1, f_range = 5.0, m_range = 5.0 | G = 1, D = 2, S = 3, Sub = 4 | Ion_c1 |
| 2 | TR1 | Sampling | key = "B" | IOFF2 | Vd = 2.0, Vg = 1.0, Compl = 0.1, f_range = 5.0, m_range = 1.0 | G = 1, D = 2, S = 3, Sub = 4 | Ioff_c1 |
| 3 | TR1 | Sampling | key = "C" | VTH2 | Vd = 2.0, Vg_start = 1.0, Vg_end = 3.5, Compl = 0.1, f_range = 5.0, m_range = 5.0 | G = 1, D = 2, S = 3, Sub = 4 | Vth_v1 |
| 4 | TR2 | Sampling | key = "A" | ION2 | Vd = 2.0, Vg = 4.5, Compl = 0.1, f_range = 5.0, m_range = 5.0 | G = 5, D = 6, S = 7, Sub = 8 | Ion_c2 |
| . . | . | . | . | . | . | . | . |
| . . | . | . | . | . | . | . | . |
| . . | . | . | . | . | . | . | . |

TABLE 23

```
void Sampling(char *key) {
    if (checkKeyAndDiePosition(key,
    currentPosition( ))) {
        Execute(0);
    }
}
```

FIG. 23 illustrates a test plan for an implementation in which arguments of the dispatch function of Table 21 are extended into the variable-length array arguments described with reference to FIG. 5 to obtain an Arry_Ctl2 function listed in Table 24. A function addr.size( ) is a function for returning the array count with respect to the parameter addr.

TABLE 24

```
void Arry_Ctl2(vector<int> addr, vector<double> vdd,
    vector<int> adT1, vector<int> adT2,
    vector<int> adT3, vector<int> vddT){
    initializeVdd(vdd[0], vddT[0]);
```

TABLE 24-continued

```
    for(int i = 0; i < addr.size( ); i++) {
        setAddress(addr[i], adT1[i], adT2[i], adT3[i]);
        Execute(i);
    }
    resetVdd(vddT[0]);
}
```

FIG. 23 illustrates turning arguments into variable-length array arguments by writing "D1" as the dispatcher label in every row that calls Arry_Ctl2 so that these rows are executed at once. The adaptive test function of Table 23 is added to the test plan of FIG. 23 to create a test plan 6200 as shown in FIGS. 24A and 24B. The test plan 6200 in FIGS. 24A and 24B performs dispatch operation control in two stages. First, a Sampling function executes a measurement function after array control is performed with the use of the Arry_Ctl2 function. The test plan 6200 includes blocks that correspond to the blocks described above with reference to FIG. 20.

Referring to FIG. 2, the dispatch operation control may be executed as follows. The test plan interpreting unit 408 reads all rows of the test plan 404. If a specification of the first dispatch function is detected, the rows are grouped by dispatch label and executed in a manner determined by the result of the grouping. Execution is performed by the dispatch function library (API) calling unit 417-1 via the relevant test plan execution unit 410-1, and further via the measurement function and dispatch function control unit 412-1, which is capable of parallel execution of dispatch functions. The processing returns to the test plan execution unit 410-1 in order to refer to the specification about the second dispatch function, or a description about a measurement function. The processing is executed in accordance with the specification about the second dispatch function, or the description about a measurement function.

The asynchronous parallel execution, synchronous parallel execution, and dispatch operation control described above can be freely combined in any test plan.

The description given above on asynchronous parallel execution uses implementation by multi-threads that share a memory space. Alternatively, the asynchronous parallel execution may be implemented by multi-processing, or multi-tasking. In such implementations, even when one flow goes down in a user code, another flow is operating in another process and can therefore detect an anomaly in the other process. This enables the test system to end all processing procedures after executing safe post-processing.

It is noted that the columns in the example test plans described above are illustrated in certain positions on the tabular-form test plans. The columns are not limited to the locations illustrated in their respective tables. The columns may be located at any suitable location on the table. Columns may be added or subtracted as desired for specific implementations.

A multi-stage test plan may also be configured in which dispatch operation control is extended to three stages or more. For example, the two-stage test plan of FIGS. 24A and 24B may be extended into a three-stage test plan with the use of another dispatch function that handles program flow control of repetition. A multi-stage test plan with even more stages may also be created by using dispatch functions that handle various types of program flow control.

The semiconductor parametric test system described above may be scaled up to a semiconductor test system.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A semiconductor test system comprising: a plurality of test head pins; a plurality of per-pin resources connectable to the plurality of test head pins on a one-to-one basis; a plurality of shared resources, each of which is connectable to one of the plurality of test head pins; and a tester controller for controlling the plurality of per-pin resources and the plurality of shared resources, the tester controller configured to execute machine-executable instructions in accordance with a user-generated tabular form test plan comprising: a plurality of program rows each row defining a test plan step; a plurality of columns defining information for performing the test plan step, where the plurality of columns includes: a measurement function column for specifying a measurement function that uses at least one of the plurality of per-pin resources and the plurality of shared resources; at least one input and output column for specifying input and output parameters of the measurement function; and an asynchronous parallel grouping column for specifying how rows that are executed by asynchronous parallel execution are to be grouped, where groups of program rows different from one another according to entries in the asynchronous parallel grouping column are executed so as to start asynchronous parallel execution concurrently.

2. A semiconductor test system according to claim 1, where the tester controller is configured to identify row groups that are to start asynchronous parallel execution concurrently based on what is written in the asynchronous parallel grouping column.

3. A semiconductor test system according to claim 1, where the tabular-form test plan further comprises a synchronous execution column for specifying a synchronous execution identifier that specifies rows to be executed in sync with one another between the row groups that are executed by asynchronous parallel execution.

4. A semiconductor test system according to claim 1, where the tabular-form test plan further comprises an exclusive execution column for specifying a flag that indicates rows to be executed exclusively in order to prevent other rows from being executed at the same time as the specified rows, out of the rows that are executed by asynchronous parallel execution.

5. A semiconductor test system according to claim 1, where the tabular-form test plan further comprises a priority column for specifying a grouping that has a higher priority than that of the grouping in the asynchronous parallel grouping column.

6. A semiconductor test system according to claim 1, where a predetermined prefix entered in the asynchronous parallel grouping column invalidates the entries in the asynchronous parallel grouping column simply and easily.

7. A semiconductor test system according to claim 1, where the tabular-form test plan further comprises a synchronous grouping column for specifying how rows that are executed by synchronous parallel execution are to be grouped, and each of a plurality of groups grouped as written in the synchronous grouping column comprises rows that have the same measurement function to be executed by the synchronous parallel execution.

8. A semiconductor test system according to claim 7, where a predetermined prefix entered in the synchronous grouping column invalidates the entries in the synchronous grouping column simply and easily.

9. A semiconductor test system according to claim 7, where the tabular-form test plan further comprises a first dispatch column for specifying a first dispatch function which performs program flow control with respect to the measurement function entered in the measurement function column, and at least one input/output column for specifying input and output parameters of the first dispatch function.

10. A semiconductor test system according to claim 1, where the tabular-form test plan further comprises a first dispatch column for specifying a first dispatch function which performs program flow control with respect to the measurement function of the measurement function column, and at least at least one input/output column for specifying input and output parameters of the first dispatch function.

11. A semiconductor test system according to claim 10, wherein the tabular-form test plan further comprises a second dispatch column for specifying a second dispatch function which performs further program flow control with respect to the first dispatch function, and at least one at least one input/output column for specifying input and output parameters of the second dispatch function.

* * * * *